(12) United States Patent
Hashimoto et al.

(10) Patent No.: US 6,593,159 B1
(45) Date of Patent: Jul. 15, 2003

(54) SEMICONDUCTOR SUBSTRATE, SEMICONDUCTOR DEVICE AND METHOD OF MANUFACTURING THE SAME

(75) Inventors: Tadao Hashimoto, Hyogo (JP); Osamu Imafuji, Osaka (JP); Masaaki Yuri, Osaka (JP); Masahiro Ishida, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/532,063

(22) Filed: Mar. 21, 2000

Related U.S. Application Data

(62) Division of application No. 09/056,500, filed on Apr. 8, 1998, now Pat. No. 6,069,394.

(30) Foreign Application Priority Data

Apr. 9, 1997 (JP) .............................................. 9-090675

(51) Int. Cl.[7] .................................................. H01L 21/00
(52) U.S. Cl. ........................................... 438/22; 438/31
(58) Field of Search .............................. 438/22, 31, 29, 438/46, 796, 725, 735; 257/13, 86, 97, 96, 99, 103; 57/17, 46

(56) References Cited

U.S. PATENT DOCUMENTS

| 4,990,972 | A | | 2/1991 | Satoh et al. | |
|---|---|---|---|---|---|
| 5,034,954 | A | | 7/1991 | Seiwa | ........................ 372/45 |
| 5,038,356 | A | | 8/1991 | Botez et al. | ................... 372/45 |
| 5,387,316 | A | * | 2/1995 | Pennell et al. | ................. 438/53 |
| 5,587,593 | A | | 12/1996 | Koide et al. | .................... 257/94 |
| 5,767,581 | A | | 6/1998 | Nakamura et al. | .......... 257/749 |
| 5,834,325 | A | * | 11/1998 | Motoki et al. | ................. 438/22 |
| 5,838,029 | A | | 11/1998 | Shakuda | ..................... 257/190 |
| 5,852,322 | A | | 12/1998 | Speckbacher | ............... 257/459 |
| 5,862,167 | A | * | 1/1999 | Sassa et al. | .................... 372/45 |
| 5,923,058 | A | * | 7/1999 | Agarwal et al. | ............. 257/198 |
| 6,008,138 | A | * | 12/1999 | Laermer et al. | ............. 438/725 |

FOREIGN PATENT DOCUMENTS

| EP | 0 332 329 | | 9/1989 | |
|---|---|---|---|---|
| EP | 0 810 674 | | 12/1997 | |
| EP | 810674 | A2 * | 12/1997 | ........... H01L/33/00 |
| JP | 8-330628 | | 12/1996 | |

* cited by examiner

Primary Examiner—Olik Chaudhuri
Assistant Examiner—Brook Kebede
(74) Attorney, Agent, or Firm—McDermott, Will & Emery

(57) ABSTRACT

A sapphire substrate, a buffer layer of undoped GaN and a compound semiconductor crystal layer successively formed on the sapphire substrate together form a substrate of a light emitting diode. A first cladding layer of n-type GaN, an active layer of undoped $In_{0.2}Ga_{0.8}N$ and a second cladding layer successively formed on the compound semiconductor crystal layer together form a device structure of the light emitting diode. On the second cladding layer, a p-type electrode is formed, and on the first cladding layer, an n-type electrode is formed. In a part of the sapphire substrate opposing the p-type electrode, a recess having a trapezoidal section is formed, so that the thickness of an upper portion of the sapphire substrate above the recess can be substantially equal to or smaller than the thickness of the compound semiconductor crystal layer.

11 Claims, 15 Drawing Sheets

SEMICONDUCTOR SUBSTRATE, SEMICONDUCTOR DEVICE AND METHOD OF MANUFACTURING THE SAME

This is a divisional of application Ser. No. 09/056,500, filed Apr. 8, 1998 now U.S. Pat. No. 6,069,394.

BACKGROUND OF THE INVENTION

The present invention relates to a semiconductor substrate including wafer-like plate-shaped crystal and a compound semiconductor crystal layer formed on the plate-shaped crystal, a method of manufacturing the semiconductor substrate, a semiconductor device, such as a semiconductor laser diode used as a light source for a pickup for an optical disk and the like, a light emitting diode used as a light source for a display device and the like, and a field effect transistor, and a method of manufacturing the semiconductor device.

Recently, nitride compound semiconductors such as GaN, InN and AlN are in the limelight as a material for a short wavelength light source and an environment resistant device because such semiconductors are of direct transition type and have a large energy gap. For example, GaN has an energy gap as large as approximately 3.4 eV at room temperature, and hence is a promising material for a light emitting element for emitting light in a range between the blue region and the ultraviolet region.

In forming a film of nitride compound semiconductor crystal, metal organic vapor deposition (hereinafter referred to as the MOCVD) is generally adopted. In the formation of a film of, for example, GaN crystal, trimethylgallium and ammonia are used as the materials, and Ga obtained by decomposing trimethylgallium and N obtained by decomposing ammonia are adhered onto a substrate having been heated at a high temperature. Thus, a monocrystal film of GaN can be obtained.

At present, a sapphire substrate is generally used as a substrate for filming the nitride compound semiconductor crystal.

In a sapphire substrate, however, the lattice constants in the a-axis direction and the c-axis direction are 4.76 Å and 12.99 Å, respectively, while those of the GaN crystal are 3.19 Å and 5.19 Å, respectively. In this manner, there is large lattice mismatch between the sapphire substrate and GaN crystal, and therefore, threading dislocations in number larger than $1 \times 10^{10}$ cm$^{-2}$ are caused during the film formation by the MOCVD from the interface between the sapphire substrate and the GaN crystal toward the inside of the GaN crystal.

Furthermore, since the sapphire substrate and the GaN crystal have different thermal expansion coefficients, the threading dislocations can be grown or cracks derived from the threading dislocations can be caused within the GaN crystal during temperature increase/decrease between room temperature and a high temperature exceeding 1000° C. in the MOCVD.

Since the threading dislocation can work as a non-radiative recombination center or can capture a carrier, the performance improvement of a light emitting diode can be obstructed by the threading dislocation. Also, when a light emitting diode is manufactured by using GaN crystal including a large number of threading dislocations, a leakage current can flow, or emission failure or device destruction can be caused due to degradation in quantum efficiency. In particular, when the threading dislocations are caused in a light emitting portion of the semiconductor device, the device destruction can acceleratingly proceed, resulting in largely decreasing the life time of the device.

As means for decreasing the threading dislocations, a method in which a buffer layer is inserted between the sapphire substrate and the GaN crystal is widely adopted at present. In this method, since a stress caused by the lattice mismatch between the sapphire substrate and the GaN crystal can be relaxed by the buffer layer, the occurrence of the threading dislocations within the GaN crystal can be suppressed. In addition, since a stress caused due to the difference in the thermal expansion coefficient during the temperature increase/decrease can be also relaxed by the buffer layer, the growth of the threading dislocations and the occurrence of cracks within the GaN crystal can be suppressed.

Furthermore, Japanese Laid-Open Patent Publication No. 4-297023 describes that a buffer layer of a GaN layer formed between a sapphire substrate and GaN crystal can effectively suppress the threading dislocations and that a light emitting diode manufactured by using this technique can attain luminance more than ten times as large as that of a conventional light emitting diode.

The light emitting diode including the buffer layer of a GaN layer inserted between the sapphire substrate and the GaN crystal disclosed in Japanese Laid-Open Patent Publication No. 4-297023 will now be described with reference to FIG. 15.

As is shown in FIG. 15, the light emitting diode includes a buffer layer 101 of undoped GaN and a device structure 102 having a doublehetero junction structure successively stacked on a sapphire substrate 100. The device structure 102 includes an n-type GaN layer 103 working as a first cladding layer, an undoped $IN_{0.2}Ga_{0.8}N$ layer 104 working as an active layer and a p-type GaN layer 105 working as a second cladding layer successively stacked. The device structure 102 is partially removed by dry etching so as to bare the inside of the n-type GaN layer 103. On the p-type GaN layer 105, a p-type electrode 106 is formed, and on the etched portion of the n-type GaN layer 103 an n-type electrode 107 is formed. The sapphire substrate 100 has a thickness of 150 μm and the device structure 102 has a thickness of 50 μm.

The present inventors manufactured a light emitting diode by a method described in Japanese Laid-Open Patent Publication No. 4-297023. Owing to the buffer layer 101 inserted between the sapphire substrate 100 and the device structure 102, the occurrence of the threading dislocations and cracks was suppressed in the device structure 102, but still there remained threading dislocations of approximately $1 \times 10^{10}$ cm$^{-2}$.

Thus, although the occurrence of the threading dislocations and cracks can be suppressed by the buffer layer 101 inserted between the sapphire substrate 100 and the device structure 102, the suppressing effect is still disadvantageously limited.

SUMMARY OF THE INVENTION

In view of the aforementioned problem, a first object of the invention is realizing a semiconductor substrate with low threading dislocation density and low crack density on which threading dislocation and cracks occurring within a device structure can be largely decreased, and a second object is realizing a semiconductor device in which threading dislocations and cracks occurring within a compound semiconductor crystal layer formed on plate-shaped crystal as well as within a device structure formed on the compound semiconductor crystal layer can be largely decreased.

The present inventors thought that the threading dislocations occurring in the device structure 102 could be decreased when part of a large number of threading dislocations proceeding from the interface between the sapphire substrate 100 and the buffer layer 101 toward the inside of the device structure 102 were made to proceed from the interface between the sapphire substrate 100 and the buffer layer 101 toward the inside of the sapphire substrate 100.

Therefore, they made various examinations on measures for making threading dislocations proceed from the interface between the sapphire substrate 100 and the buffer layer 101 toward the inside of the sapphire substrate 100. As a result, they found that the threading dislocations could proceed from the interface toward the inside of the sapphire substrate 100 by setting the thickness of the sapphire substrate 100 smaller than the thickness of the n-type GaN layer 103, thereby decreasing the threading dislocations proceeding from the interface toward the inside of the n-type GaN layer 103.

Also, they found that when the thus obtained sapphire substrate 100 and n-type GaN layer 103 are used as a substrate and a device structure is formed on this substrate, a semiconductor device including a smaller number of threading dislocations caused in the device structure can be realized.

The present invention was devised on the basis of the aforementioned findings, and is specifically realized as follows, and in the following description, a "semiconductor substrate" means a wafer-like plate and a "substrate" means a plate on which a semiconductor chip is formed:

The semiconductor substrate of the invention comprises wafer-like plate-shaped crystal; a compound semiconductor crystal layer formed on the plate-shaped crystal and having a different lattice constant from the plate-shaped crystal; and a recess formed on a bottom surface of the plate-shaped crystal to make respective device forming areas in the plate-shaped crystal have a thickness substantially equal to or smaller than a thickness of the compound semiconductor crystal layer.

In the semiconductor substrate of this invention, the wafer-like plate-shaped crystal has the recess formed on the bottom surface thereof so as to make the respective device forming areas in the plate-shaped crystal have a thickness substantially equal to or smaller than the thickness of the compound semiconductor crystal layer. Therefore, when a device structure is formed on each device forming area of the semiconductor substrate of this invention, it is possible to obtain a semiconductor device in which the thickness of the plate-shaped crystal is substantially equal to or smaller than the thickness of the compound semiconductor crystal layer and threading dislocations caused in the compound semiconductor crystal layer are decreased.

The method of manufacturing a semiconductor substrate of this invention comprises a recess forming step of forming a recess on a bottom surface of wafer-like plate-shaped crystal; and a crystal layer forming step of forming, on the plate-shaped crystal, a compound semiconductor crystal layer having a different lattice constant from the plate-shaped crystal, wherein the recess forming step includes a step of forming the recess so as to make respective device forming areas in the plate-shaped crystal have a thickness substantially equal to or smaller than a thickness of the compound semiconductor crystal layer.

The method of manufacturing a semiconductor substrate of this invention comprises the step of forming the recess on the bottom surface of the wafer-like plate-shaped crystal so as to make the respective device forming areas in the plate-shaped crystal have a thickness substantially equal to or smaller than the thickness of the compound semiconductor crystal layer. Accordingly, when a device structure is formed on each device forming area of the semiconductor substrate manufactured by this method, it is possible to obtain a semiconductor device in which the thickness of the plate-shaped crystal is substantially equal to or smaller than the thickness of the compound semiconductor crystal layer and threading dislocations caused in the compound semiconductor crystal layer are decreased.

The method of manufacturing a semiconductor substrate of this invention preferably further comprises, after the crystal layer forming step, a plate-shaped crystal removing step of removing the plate-shaped crystal.

In this manner, a semiconductor substrate including no plate-shaped crystal can be obtained. Therefore, there does not arise a problem derived from the difference in the lattice constant and the thermal expansion coefficient between the plate-shaped crystal and a device structure formed on the compound semiconductor crystal layer, resulting in remarkably improving the crystallinity of the device structure formed on the compound semiconductor crystal layer.

The first semiconductor device of the invention comprises a substrate including plate-shaped crystal and a compound semiconductor crystal layer formed on the plate-shaped crystal and having a different lattice constant from the plate-shaped crystal; a device structure formed on the substrate; and a recess formed on the bottom surface of the plate-shaped crystal to make a thickness at a center of the plate-shaped crystal substantially equal to or smaller than a thickness of the compound semiconductor crystal layer.

In the first semiconductor device, since the thickness at the center of the plate-shaped crystal is substantially the same as or smaller than the thickness of the compound semiconductor crystal layer, strain derived from the difference in the lattice constant and the thermal expansion coefficient between the plate-shaped crystal and the compound semiconductor crystal layer is shared with the plate-shaped crystal. Therefore, threading dislocations occur also within the plate-shaped crystal.

In the first semiconductor device, the strain derived from the difference in the lattice constant and the thermal expansion coefficient between the plate-shaped crystal and the compound semiconductor crystal layer is shared with the plate-shaped crystal and the threading dislocations occur within the plate-shaped crystal. Accordingly, the strain derived from the difference in the lattice constant and the thermal expansion coefficient can be relaxed within the compound semiconductor crystal layer, resulting in decreasing the threading dislocations caused within the compound semiconductor crystal layer. As a result, the crystallinity of the compound semiconductor crystal layer, and furthermore, the crystallinity of a device structure formed on the compound semiconductor crystal layer. Thus, the characteristic and life time of a functional device including the device structure can be improved.

Furthermore, in the first semiconductor device, since the recess is formed on the bottom surface of the plate-shaped crystal so as to make the thickness at the center of the plate-shaped crystal substantially equal to or smaller than the thickness of the compound semiconductor crystal layer, the thickness in the periphery of the substrate can be substantially the same as that of a conventional semiconductor device. Therefore, the strength of the semiconductor device can be retained while improving the crystallinity of the compound semiconductor crystal layer.

When the first semiconductor device further comprises an electrode for voltage application formed above the device structure, a bottom of the recess is preferably larger than the electrode.

In this manner, the crystallinity of the compound semiconductor crystal layer, and furthermore, the crystallinity of a voltage applied portion of the device structure formed on the compound semiconductor crystal layer can be improved. As a result, the characteristic and life time of a functional device such as a light emitting element including the device structure can be definitely improved.

In the first semiconductor device, the plate-shaped crystal preferably includes a plate-like base portion of a crystal layer and a frame portion formed in a periphery of a bottom face of the base portion out of a material having etch selectivity against the base portion.

In this case, the recess can be definitely formed on the bottom surface of the plate-shaped crystal by forming the plate-like base portion of the crystal layer on a plate-like body and selectively etching the center of the bottom of the plate-like body.

In the first semiconductor device, the plate-shaped crystal preferably includes a plate-like base portion of a crystal layer and a side portion formed in a side part of a bottom face of the base portion out of a material having etch selectivity against the base portion.

In this case, the recess can be definitely formed on the bottom surface of the plate-shaped crystal by forming the plate-like base portion of the crystal layer on a plate-like body and selectively etching the center of the bottom of the plate-like body.

The second semiconductor device of this invention comprises a substrate including plate-shaped crystal and a compound semiconductor crystal layer formed on the plate-shaped crystal and having a different lattice constant from the plate-shaped crystal; and a device structure formed on the substrate, wherein a thickness of the plate-shaped crystal is substantially equal to or smaller than a thickness of the compound semiconductor crystal layer.

In the second semiconductor device, since the thickness of the plate-shaped crystal is substantially the same as or smaller than the thickness of the compound semiconductor crystal layer, the strain derived from the difference in the lattice constant and the thermal expansion coefficient between the plate-shaped crystal and the compound semiconductor crystal layer is shared with the plate-shaped crystal. Therefore, threading dislocations occur also within the plate-shaped crystal. Accordingly, the strain derived from the difference in the lattice constant and the thermal expansion can be relaxed within the compound semiconductor crystal layer, resulting in decreasing the threading dislocations caused within the compound semiconductor crystal layer. As a result, the crystallinity of the compound semiconductor crystal layer, and furthermore, the crystallinity of a device structure formed on the compound semiconductor crystal layer can be improved. Thus, the characteristic and life time of a functional device including the device structure can be improved.

In the second semiconductor device, the plate-shaped crystal preferably includes a plate-like body and a crystal layer formed on the plate-like body out of a different material from the plate-like body.

In the first or second semiconductor device, the compound semiconductor crystal layer is preferably made of a nitride compound represented by $Al_xGa_yIn_{1-x-y}N$, wherein $0 \leq X \leq 1$ and $0 \leq y \leq 1$.

The first method, of this invention, of manufacturing a semiconductor device, including a substrate having plate-shaped crystal and a compound semiconductor crystal layer formed on the plate-shaped crystal and having a different lattice constant from the plate-shaped crystal, and a device structure formed on the substrate, comprises a recess forming step of forming a recess on a bottom surface of each device forming area in wafer-like plate-shaped crystal to make a thickness at a center of the device forming area substantially equal to or smaller than a thickness of the compound semiconductor crystal layer to be formed on the plate-shaped crystal; a crystal layer forming step of forming a semiconductor substrate including the plate-shaped crystal and the compound semiconductor crystal layer by forming the compound semiconductor crystal layer on the plate-shaped crystal; a device structure forming step of forming the device structure on each device forming area of the semiconductor substrate; and a cutting step of forming the semiconductor device by cutting the semiconductor substrate.

In the first method of manufacturing a semiconductor device, after the recess is formed on the bottom surface of each device forming area of the plate-shaped crystal so as to make the thickness at the center of each device forming area substantially equal to or smaller than the thickness of the compound semiconductor crystal layer to be formed on the plate-shaped crystal, the compound semiconductor crystal layer is formed on the plate-shaped crystal. Therefore, the first semiconductor device, which includes the recess formed on the bottom surface of the plate-shaped crystal so as to make the thickness at the center of the plate-shaped crystal substantially the same as or smaller than the thickness of the compound semiconductor crystal layer and has improved crystallinity, can be definitely manufactured by this method.

In the first method of manufacturing a semiconductor device, the recess forming step preferably includes a step of forming, on a plate-like body, a plate-like base portion of a crystal layer having etch selectivity against the plate-like body; and a step of forming a frame portion out of the plate-like body on a bottom face of the base portion by conducting selective etching on the plate-like body with a periphery of the plate-like body remaining.

In this case, since the periphery of the plate-like body can remain through the etching on the plate-like body having the etch selectivity against the base portion, the frame portion can be definitely formed out of the plate-like body on the bottom face of the base portion.

In the first method of manufacturing a semiconductor device, the recess forming step preferably includes a step of forming, on a plate-like body, a plate-like base portion of a crystal layer having etch selectivity against the plate-like body; and a step of forming a side portion out of the plate-like body on a bottom face of the base portion by conducting selective etching on the plate-like body with a side part of the plate-like body remaining.

In this case, since the side part of the plate-like body can remain through the etching on the plate-like body having the etch selectivity against the base portion, the side portion can be definitely formed out of the plate-like body on the bottom face of the base portion.

The first method of manufacturing a semiconductor device preferably further comprises, between the crystal layer forming step and the device structure forming step, a heat treatment step of moving threading dislocations caused within the compound semiconductor crystal layer to the plate-shaped crystal by conducting a heat treatment on the compound semiconductor crystal layer.

In this case, the threading dislocations caused within the compound semiconductor crystal layer can be moved to the plate-shaped crystal, and hence, the threading dislocations caused within the compound semiconductor crystal layer can be further decreased. As a result, the crystallinity of the compound semiconductor crystal layer can be further improved.

The second method, of this invention, of manufacturing a semiconductor device including a substrate having plate-shaped crystal and a compound semiconductor crystal layer formed on the plate-shaped crystal and having a different lattice constant from the plate-shaped crystal, and a device structure formed on the substrate, comprises a recess forming step of forming a recess on a bottom surface of wafer-like plate-shaped crystal to make respective device forming areas in the plate-shaped crystal have a thickness substantially equal to or smaller than a thickness of the compound semiconductor crystal layer to be formed on the plate-shaped crystal; a crystal layer forming step of forming a semiconductor substrate including the plate-shaped crystal and the compound semiconductor crystal layer by forming the compound semiconductor crystal layer on the plate-shaped crystal; a device structure forming step of forming the device structure on each device forming area of the semiconductor substrate; and a cutting step of forming the semiconductor device by cutting the semiconductor substrate.

In the second method of manufacturing a semiconductor device, after the recess is formed on the bottom surface of the plate-shaped crystal so as to make the thickness of each device forming area in the plate-shaped crystal substantially the same as or smaller than the thickness of the compound semiconductor crystal layer to be formed on the plate-shaped crystal, the compound semiconductor crystal layer is formed on the plate-shaped crystal. Therefore, it is possible to obtain, by this method, the second semiconductor device in which the thickness of the plate-shaped crystal is substantially the same as or smaller than the thickness of the compound semiconductor crystal layer and the crystallinity of the compound semiconductor crystal layer is improved.

The second method of manufacturing a semiconductor device preferably further comprises, between the crystal layer forming step and the device structure forming step, a heat treatment step of moving threading dislocations caused in the compound semiconductor crystal layer to the plate-shaped crystal by conducting a heat treatment on the compound semiconductor crystal layer.

In this case, since the threading dislocations caused within the compound semiconductor crystal layer can be moved to the plate-shaped crystal, the threading dislocations caused within the compound semiconductor crystal layer can be further decreased. As a result, the crystallinity of the compound semiconductor crystal layer can be further improved.

BRIEF DESCRIPTION OF THE DRAWINGS

FIGS. 4(a) and 4(b) illustrate a light emitting diode according to a second embodiment of the invention, wherein FIG. 4(a) is a sectional view thereof and FIG. 4(b) is a bottom view thereof;

DETAILED DESCRIPTION OF THE INVENTION

Embodiment 1

In a first embodiment of the invention, a semiconductor substrate used for forming a semiconductor device, such as a light emitting diode, a semiconductor laser diode and a field effect transistor, and a method of manufacturing the semiconductor substrate will be described with reference to FIGS. 1(a) through 1(c), 2(a), 2(b), 3(a) and 3(b).

Figure 1A:
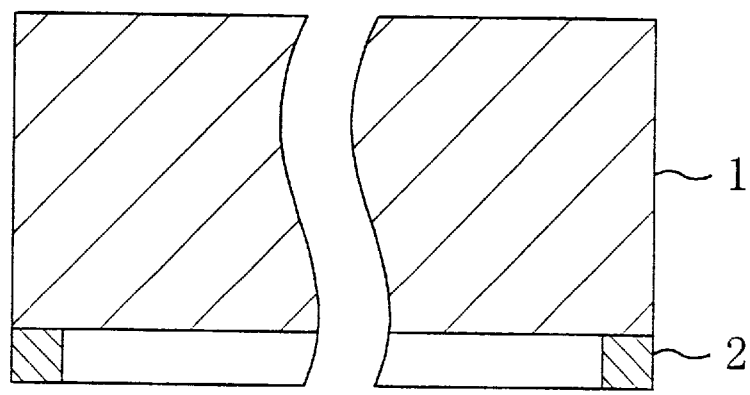
FIGS. 1(a) through 1(c) are sectional views for showing manufacturing procedures for a semiconductor substrate according to a first embodiment of the invention.
Figure 1B:
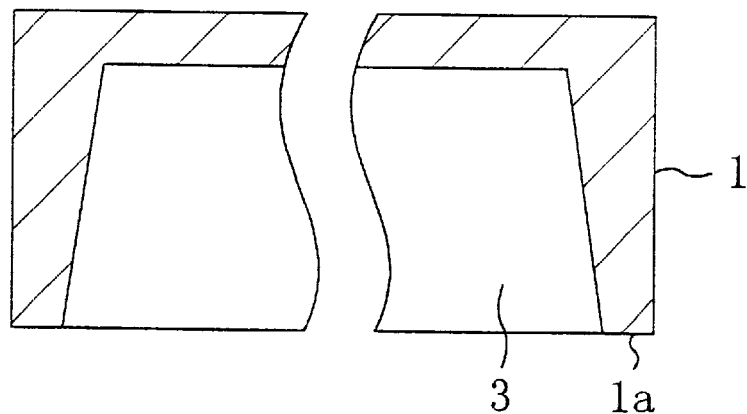

First, as is shown in FIG. 1(a), in an area excluding a device forming area on the bottom surface of a sapphire substrate 1, that is, wafer-like plate-shaped crystal, having a thickness of, for example, 300 $\mu$m, a mask 2 of a metal such as nickel with a thickness of 20 $\mu$m is formed by vacuum evaporation. Then, the bottom surface of the sapphire substrate 1 is exposed to an etching gas atmosphere including, for example, a mixture of a hydrogen gas and a hydrogen chloride gas at a pressure of 1 Torr under application of a discharge voltage of, for example, 600 V. As a result, a portion of the sapphire substrate 1 not covered with the mask 2 is removed by etching as is shown in FIG. 1(b). Thus, a recess 3 is formed on the bottom surface of the sapphire substrate 1, and an upper portion of the sapphire substrate 1 above the recess 3 is made to have a thickness of 50 $\mu$m. Accordingly, in a portion of the sapphire substrate 1 excluding the recess 3, a projection 1a is formed for retaining a strength of the sapphire substrate 1.

Figure 3A:
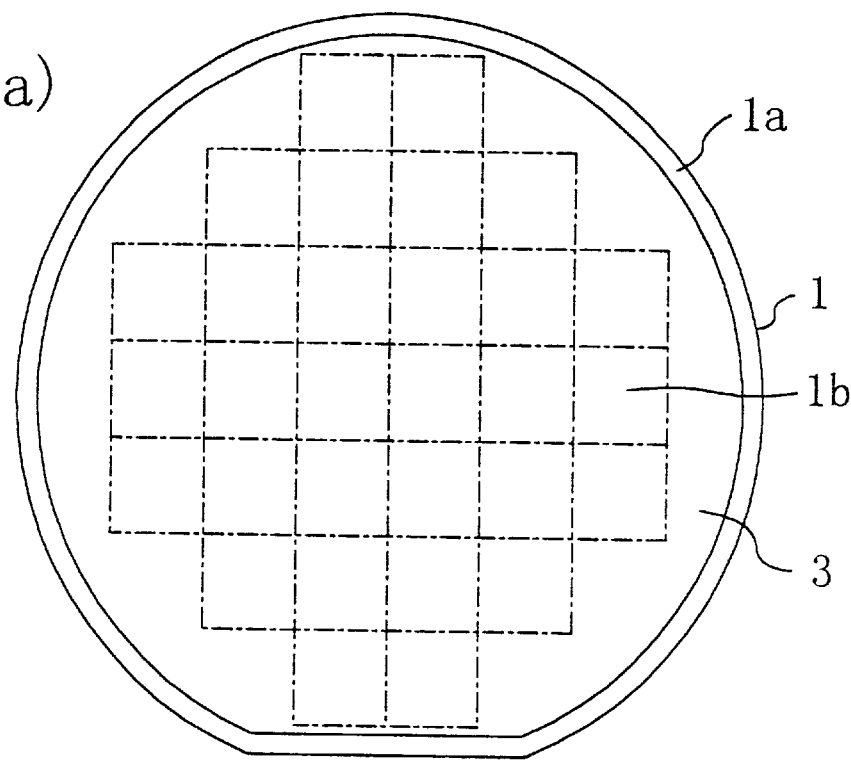
FIGS. 3(a) and 3(b) are bottom views for showing a manufacturing procedure for the semiconductor substrate of the first embodiment.
Figure 3B:
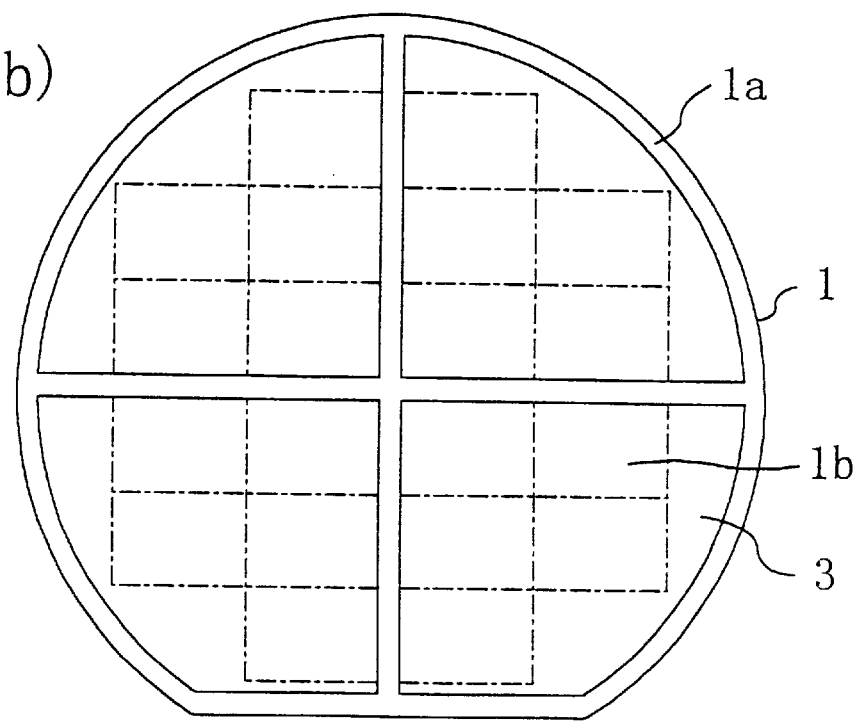

In a plan view, the projection 1a of the sapphire substrate 1 can be in a ring shape extending along the periphery of the sapphire substrate 1 as is shown in FIG. 3(a), or in a shape extending along the periphery of the sapphire substrate 1 and crossing at the center as is shown in FIG. 3(b). Significantly, the projection 1a is prevented from being formed in a device forming area 1b.

Figure 1C:
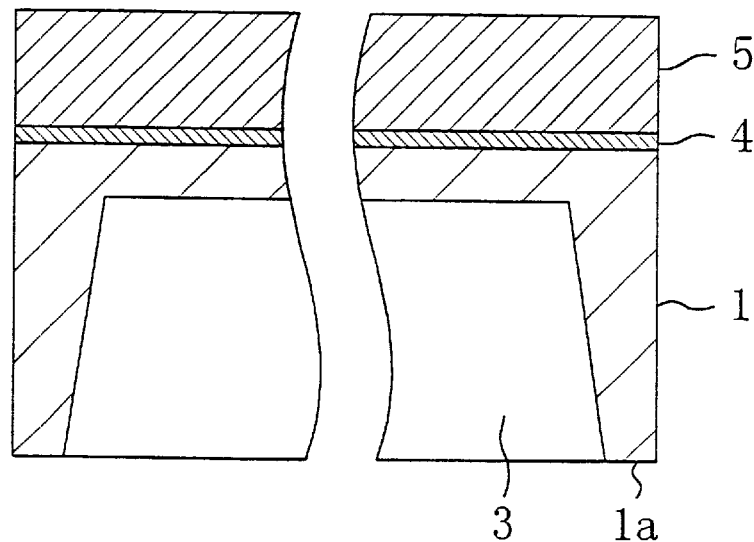

Next, as is shown in FIG. 1(c), on the top surface of the sapphire substrate 1, a buffer layer 4 of undoped GaN with a thickness of 30 nm is formed by, for example, MOCVD. Then, on the buffer layer 4, a compound semiconductor crystal layer 5 of n-type GaN with a thickness of 100 µm is formed by, for example, chloride vapor phase epitaxy.

Figure 2A:
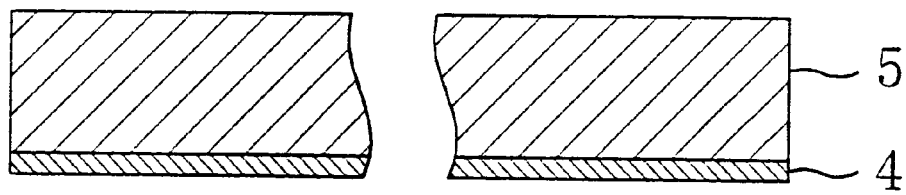
FIGS. 2(a) and 2(b) are sectional views for showing other manufacturing procedures for the semiconductor substrate of the first embodiment.

Then, as is shown in FIG. 2(a), the sapphire substrate 1 including the recess 3 is removed, resulting in obtaining a semiconductor substrate including the buffer layer 4 and the compound semiconductor crystal layer 5. It goes without saying that the semiconductor substrate can include merely the compound semiconductor crystal layer 5 without forming the buffer layer 4.

Figure 2B:
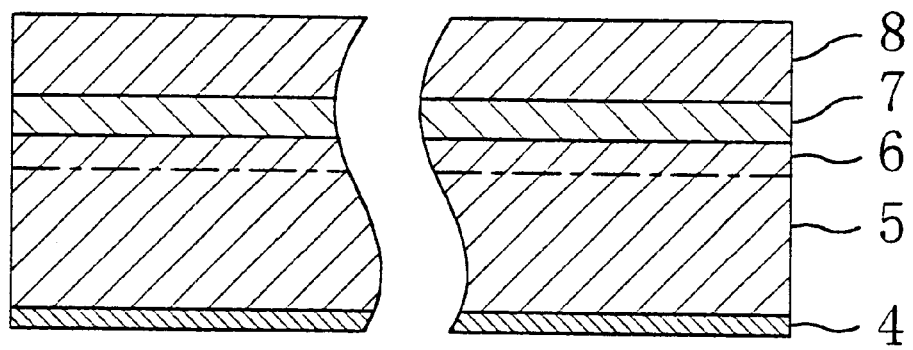

Next, as is shown in FIG. 2(b), on the compound semiconductor crystal layer 5, a first cladding layer 6 of n-type GaN with a thickness of 2 µm is formed by, for example, the MOCVD, and on the first cladding layer 6 of the semiconductor substrate, an active layer 7 of undoped $In_{0.2}Ga_{0.8}N$ with a thickness of 3 nm and a second cladding layer 8 of p-type GaN with a thickness of 1 µm are successively formed. In this manner, a device structure including the first cladding layer 6, the active layer 7 and the second cladding layer 8 can be formed on the semiconductor substrate.

According to the semiconductor substrate of the first embodiment, since the semiconductor substrate including the buffer layer 4 and the compound semiconductor crystal layer 5 does not include the sapphire substrate 1, there does not arise a problem derived from the difference in the lattice constant and the thermal expansion coefficient between the sapphire substrate 1 and a device structure formed on the compound semiconductor crystal layer 5. Therefore, threading dislocations occurring within the device structure can be largely decreased. Accordingly, the crystallinity of the device structure can be remarkably improved.

Without removing the sapphire substrate 1 including the recess 3, the device structure including the first cladding layer 6, the active layer 7 and the second cladding layer 8 can be formed on the semiconductor substrate including the sapphire substrate 1 having the recess 3, the buffer layer 4 and the compound semiconductor crystal layer 5.

In this case, the sapphire substrate 1 has the recess 3 formed on its bottom surface so as to make the respective device forming areas 1b in the sapphire substrate 1 have a thickness substantially the same as the thickness of the compound semiconductor crystal layer 5 (the thickness of the compound semiconductor crystal layer 5±10%). Therefore, strain derived from the difference in the lattice constant and the thermal expansion coefficient between the sapphire substrate 1 and the compound semiconductor crystal layer 5 is shared with the sapphire substrate 1, resulting in causing threading dislocations in the sapphire substrate 1. Accordingly, the strain derived from the difference in the lattice constant and the thermal expansion coefficient can be relaxed within the compound semiconductor crystal layer 5, and the threading dislocations caused within the compound semiconductor crystal layer 5 can be decreased. As a result, the crystallinity of the compound semiconductor crystal layer 5, and furthermore, the crystallinity of the device structure formed on the compound semiconductor crystal layer 5 can be improved.

Embodiment 2

Figure 4A:
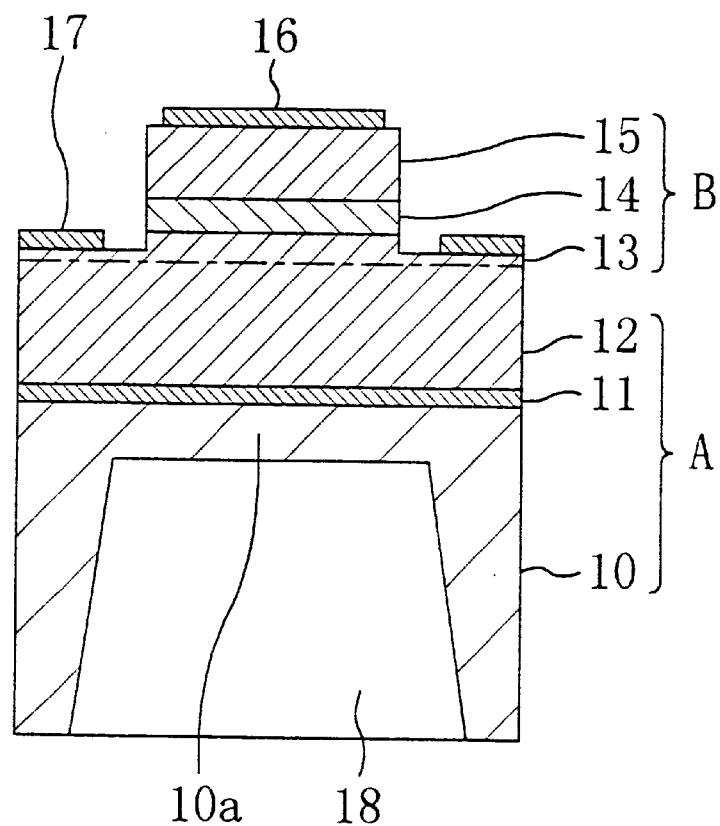
Figure 4B:
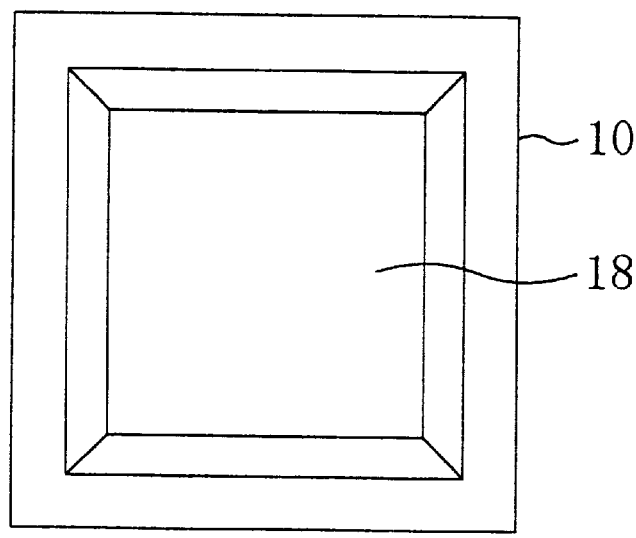

Now, a light emitting diode, that is, a semiconductor device according to a second embodiment of the invention, will be described with reference to FIGS. 4(a) and 4(b). FIGS. 4(a) and 4(b) illustrate the light emitting diode of the second embodiment, in which FIG. 4(a) is a sectional view thereof and FIG. 4(b) is a bottom view thereof.

As is shown in FIG. 4(a), on a sapphire substrate 10 with a thickness of 300 µm, a buffer layer 11 of undoped GaN with a thickness of 30 nm and a compound semiconductor crystal layer 12 of n-type GaN with a thickness of 100 µm are successively formed. The sapphire substrate 10, the buffer layer 11 and the compound semiconductor crystal layer 12 together form a substrate A of the light emitting diode.

On the compound semiconductor crystal layer 12, a first cladding layer 13 of n-type GaN with a thickness of 2 µm, an active layer 14 of undoped $In_{0.2}Ga_{0.8}N$ with a thickness of 3 nm and a second cladding layer 15 of p-type GaN with a thickness of 1 µm are successively formed. The first cladding layer 13, the active layer 14 and the second cladding layer 15 together form a device structure B of the light emitting diode. In this case, the device structure B is partially removed so as to bare the inside of the first cladding layer 13.

On the second cladding layer 15, a p-type electrode 16 of, for example, a metal multilayer film including nickel is formed, and on the first cladding layer 13, an n-type electrode 17 of, for example, a metal multilayer film including aluminum is formed.

As a characteristic of the second embodiment, in a part of the sapphire substrate 10 opposing the p-type electrode 16, a recess 18 having a trapezoidal section with a depth of 250 µm is formed as is shown in FIGS. 4(a) and 4(b). An upper portion 10a of the sapphire substrate 10 above the recess 18 has a thickness of 50 µ. In this case, the size of the upper portion 10a of the sapphire substrate 10 above the recess 18 is slightly larger than the size of the p-type electrode 16.

In the light emitting diode of the second embodiment, since the thickness of the upper portion 10a of the sapphire substrate 10 above the recess 18 (namely, 50 µm) is smaller than the thickness of the compound semiconductor crystal layer 12 (namely, 100 µm), strain derived from the difference in the lattice constant and the thermal expansion coefficient between the sapphire substrate 10 and the compound semiconductor crystal layer 12 is shared with the sapphire substrate 10. Therefore, threading dislocations also occur within the sapphire substrate 10. Accordingly, the strain caused within the compound semiconductor crystal layer 12 due to the difference in the lattice constant and the thermal expansion coefficient can be relaxed, and hence, threading dislocations occurring within the compound semiconductor crystal layer 12 can be decreased. As a result, the crystallinity of the compound semiconductor crystal layer 12, and furthermore, the crystallinity of the device structure B can be improved. Accordingly, the luminance and the life time of the light emitting diode of the second embodiment are largely improved as compared with those of a conventional light emitting diode.

Figure 5:
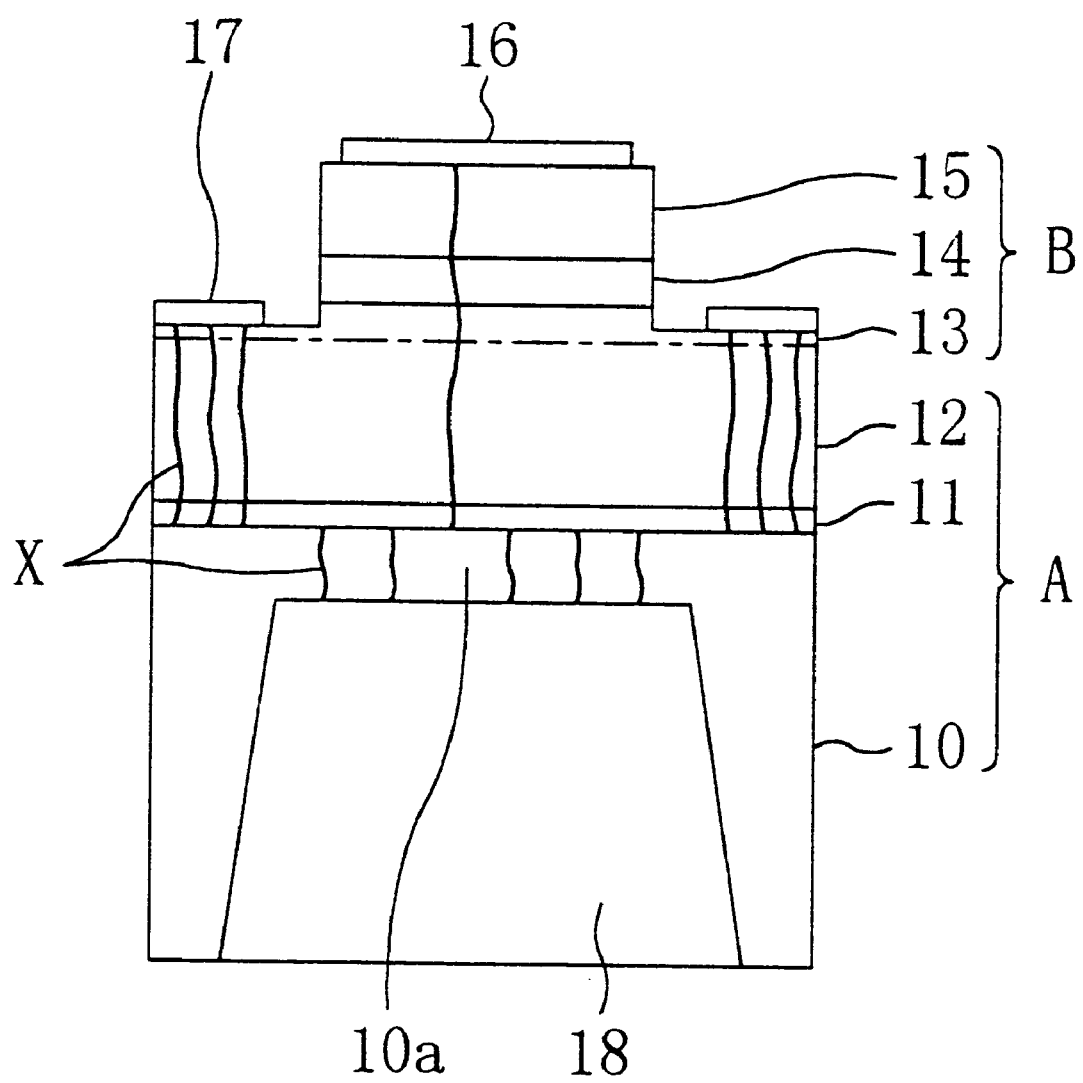
FIG. 5 is a diagram for showing a result of observation with a transmission electron microscope of a section of a light emitting diode according to the second embodiment.

The section of the light emitting diode of the second embodiment observed with a transmission electron microscope is shown in FIG. 5. As is shown in FIG. 5, it was confirmed that the threading dislocations X derived from the lattice mismatch occurred in both the sapphire substrate 10 and the compound semiconductor crystal layer 12, and that the number of threading dislocations X caused within the compound semiconductor crystal layer 12 is largely decreased as compared with that in the conventional light emitting diode. In this manner, it was also confirmed that the occurrence of the threading dislocations X within the sapphire substrate 10 can decrease the threading dislocations X caused within the compound semiconductor crystal layer 12

In the light emitting diode of the second embodiment, the number of the threading dislocations caused within the compound semiconductor crystal layer 12 is $1 \times 10^6$ cm$^{-2}$, which is 1/10000 as small as that caused in the conventional light emitting diode.

Also, the light emitting diode of the second embodiment has a peak wavelength of 450 nm, luminance of 6 cd, and a life time of more than 50000 hours in an operation at room temperature. Thus, the present light emitting diode can attain the luminance and the life time more than twice as large as those of the conventional light emitting diode.

In the second embodiment, the n-type GaN layer of the compound semiconductor crystal layer 12 and the first cladding layer 13 can be replaced with n-type Al$_x$Ga$_y$In$_{1-x-y}$N (wherein $0 \leq X \leq 1$ and $0 \leq y \leq 1$), and the p-type GaN layer of the second cladding layer 15 can be replaced with p-type Al$_x$Ga$_y$In$_{1-x-y}$N ($0 \leq X \leq 1$ and $0 \leq y \leq 1$).

Also, in the second embodiment, the sapphire substrate 10 can be replaced with an oxide substrate such as a LiGaO$_2$ substrate, a SiC substrate, a Si substrate, a GaAs substrate, a GaP substrate or the like.

Figure 6:
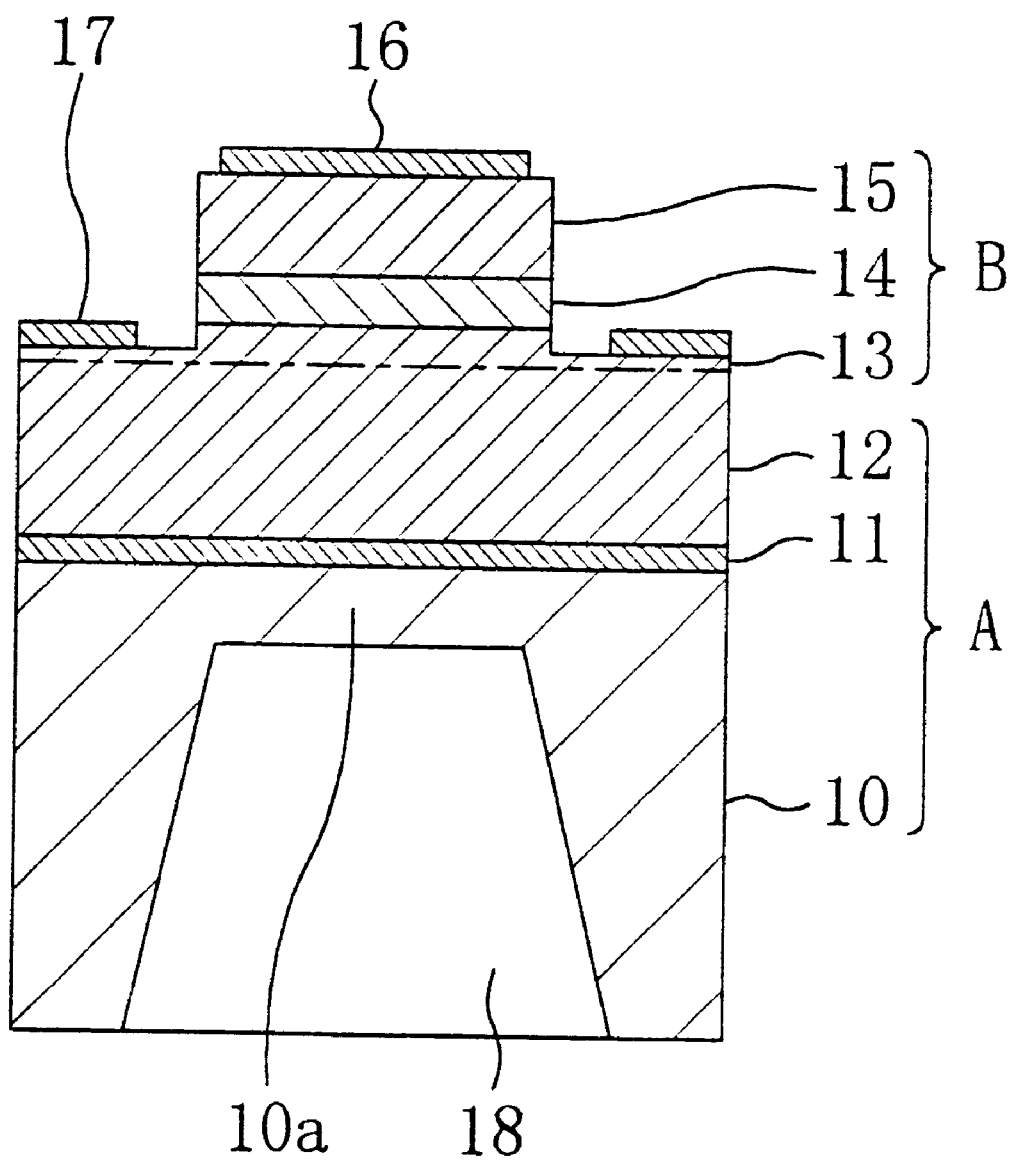
FIG. 6 is a sectional view of the light emitting diode according to a modification of the second embodiment of the invention.

Furthermore, although the size of the upper portion 10a of the sapphire substrate 10 above the recess 18 is slightly larger than the size of the p-type electrode 16 in the second embodiment, the size of the upper portion 10a of the sapphire substrate 10 above the recess 18 can be smaller than the size of the p-type electrode 16 as is shown in FIG. 6. In this case, the number of the threading dislocations caused within the sapphire substrate 10 is smaller than in the second embodiment, and hence, the threading dislocations caused in the compound semiconductor crystal layer 12 are increased. However, the number of the threading dislocations in the compound semiconductor crystal layer 12 is still remarkably smaller than in the conventional light emitting diode.

Moreover, in the second embodiment, the thickness of the upper portion 10a of the sapphire substrate 10 above the recess 18 is smaller by 50 μm than the thickness of the compound semiconductor crystal layer 12, which does not limit the invention. When the thickness of the upper portion 10a of the sapphire substrate 10 above the recess 18 is substantially equal to the thickness of the compound semiconductor crystal layer 12 (specifically, the thickness of the compound semiconductor crystal layer 12 ±10%) or smaller, the number of the threading dislocations caused in the compound semiconductor crystal layer 12 can be decreased.

Now, a method of manufacturing the light emitting diode of the second embodiment will be described with reference to FIGS. 7(a) through 7(c).

Figure 7A:
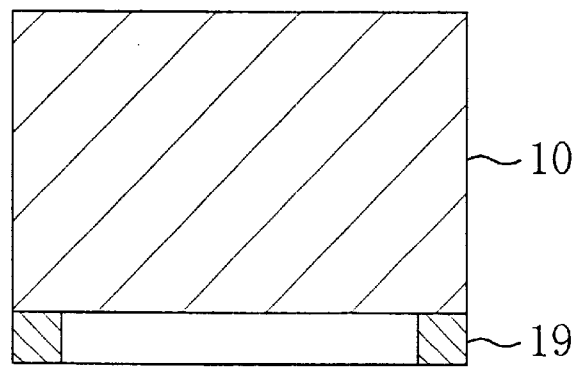
FIGS. 7(a) through 7(c) are sectional views for showing manufacturing procedures for the light emitting diode of the second embodiment.
Figure 7B:
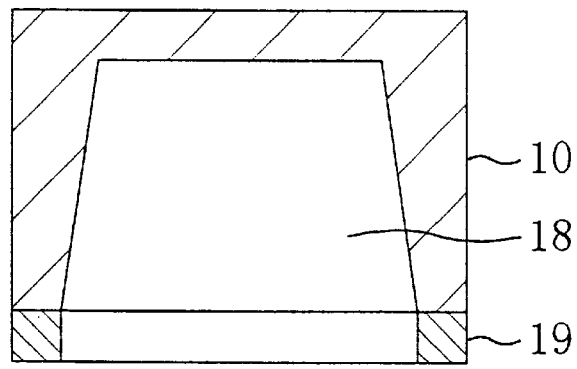
Figure 7C:
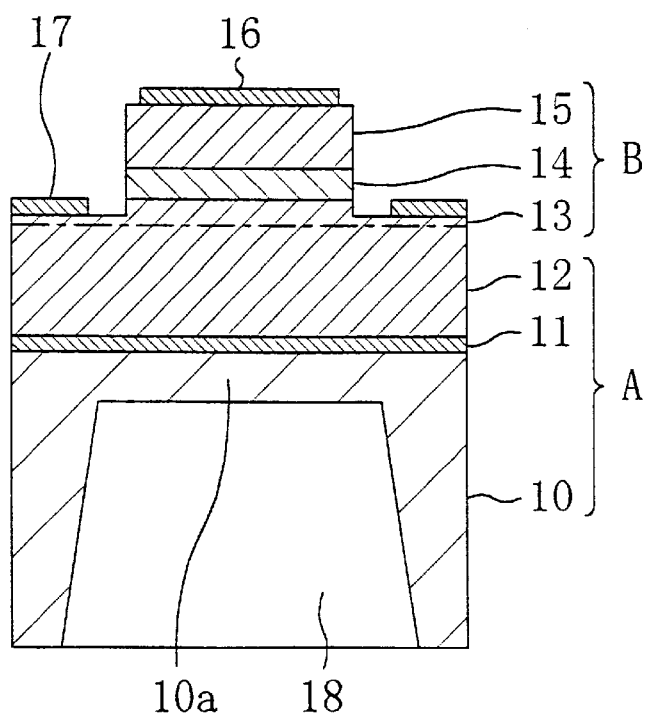

First, as is shown in FIG. 7(a), in the periphery of one surface (bottom face) of the sapphire substrate 10 with a thickness of 300 μm, a mask 19 of a metal such as nickel with a thickness of 20 μm is formed by vacuum evaporation.

Next, the sapphire substrate 10 is placed in a dry etching system (not shown). Then, this surface of the sapphire substrate 10 is exposed to an etching gas of, for example, a mixture of a hydrogen gas and a hydrogen chloride gas at a pressure of 1 Torr under application of a discharge voltage of, for example, 600 V. As a result, a portion of the sapphire substrate 10 not covered with the mask 19 is etched into a thickness of 50 μm as is shown in FIG. 7(b).

Next, the sapphire substrate 10 is taken out of the dry etching system, and the mask 19 is removed. Then, on the other surface (i.e., top face) of the sapphire substrate 10, the buffer layer 11 of undoped GaN with a thickness of 30 nm is formed by the MOCVD, and on the buffer layer 11, the compound semiconductor crystal layer 12 of n-type GaN with a thickness of 100 μm is formed by the chloride vapor phase epitaxy. Thus, the substrate A of the light emitting diode including the sapphire substrate 10, the buffer layer 11 and the compound semiconductor crystal layer 12 is obtained. It goes without saying that the substrate A can include merely the sapphire substrate 10 and the compound semiconductor crystal layer 12 without forming the buffer layer 11.

Then, on the compound semiconductor crystal layer 12, the first cladding layer 13 of n-type GaN with a thickness of 2 μm, the active layer 14 of undoped In$_{0.2}$Ga$_{0.8}$N with a thickness of 3 nm, and the second cladding layer 15 of p-type GaN with a thickness of 1 μm are successively formed by the MOCVD. Thus, the device structure B of the light emitting diode including the first cladding layer 13, the active layer 14 and the second cladding layer 15 is formed. Thereafter, a side portion of the device structure B is partially removed so as to bare the inside of the first cladding layer 13. Then, the p-type electrode 16 of, for example, the metal multilayer film including nickel is formed on the second cladding layer 15, and the n-type electrode 17 of, for example, the metal multilayer film including aluminum is formed on the first cladding layer 13. In this manner, the light emitting diode of the second embodiment can be completed as is shown in FIG. 7(c).

Embodiment 3

Figure 8:
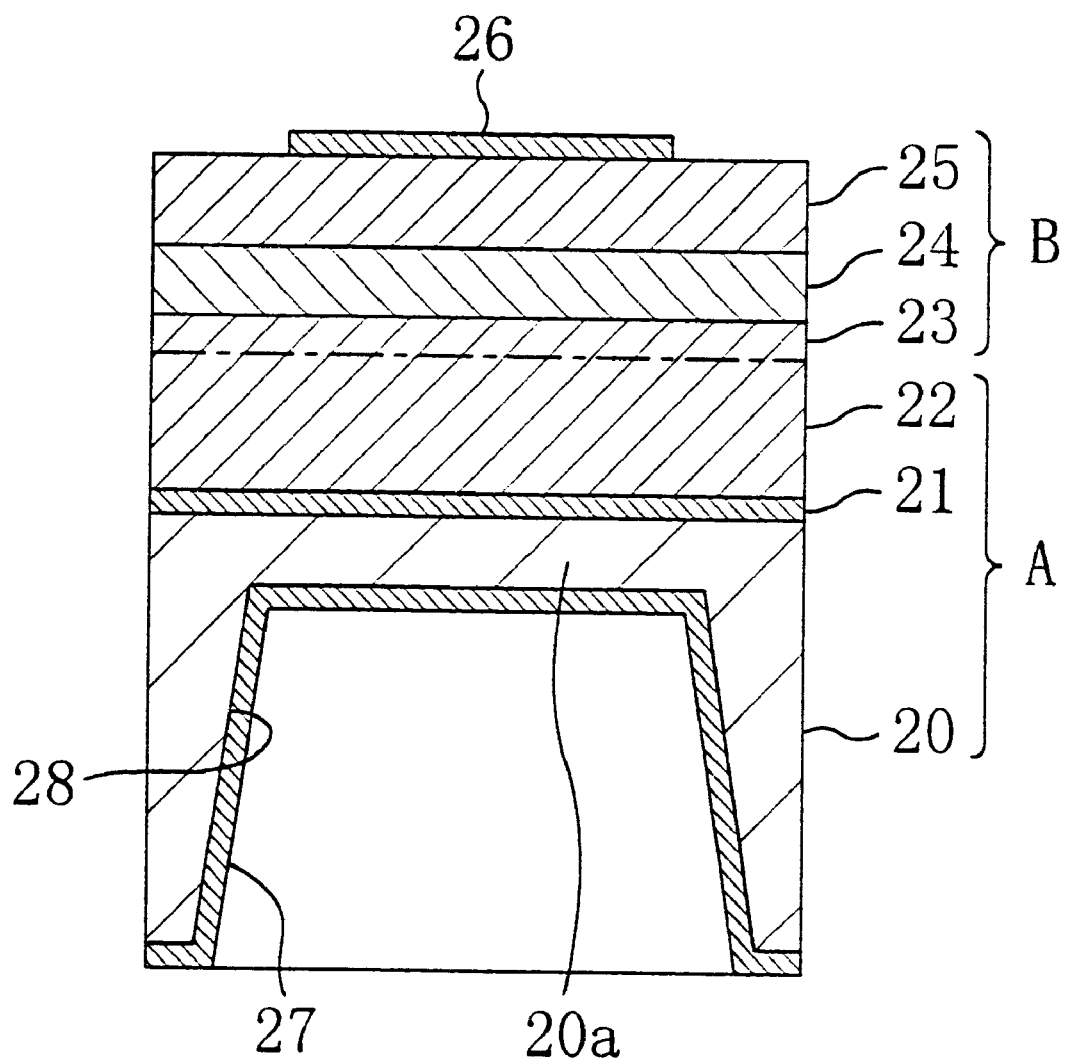
FIG. 8 is a sectional view of a light emitting diode according to a third embodiment of the invention.

A light emitting diode, that is, a semiconductor device according to a third embodiment of the invention, will now be described with reference to FIG. 8. FIG. 8 is a sectional view of the light emitting diode of the third embodiment.

As is shown in FIG. 8, on an n-type GaAs substrate 20 with a thickness of 300 μm, a buffer layer 21 of n-type GaN with a thickness of 30 nm and a compound semiconductor crystal layer 22 of n-type GaN with a thickness of 100 μm are successively formed. The n-type GaAs substrate 20, the buffer layer 21 and the compound semiconductor crystal layer 22 together form a substrate A of the light emitting diode.

On the compound semiconductor crystal layer 22, a first cladding layer 23 of n-type GaN with a thickness of 2 μm, an active layer 24 of undoped In$_{0.2}$Ga$_{0.8}$N with a thickness of 3 nm and a second cladding layer 25 of p-type GaN with a thickness of 1 μm are successively formed. The first cladding layer 23, the active layer 24 and the second cladding layer 25 together form a device structure B of the light emitting diode. On the second cladding layer 25, a p-type electrode 26 is formed.

As a characteristic of the light emitting diode of the third embodiment, in a part of the n-type GaAs substrate 20 opposing the p-type electrode 26, a recess 28 having a trapezoidal section with a depth of 250 μm is formed, and an upper portion 20a of the n-type GaAs substrate 20 above the recess 28 has a thickness of 50 μ. In this case, the size of the upper portion 20a of the n-type GaAs substrate 20 above the recess 28 is slightly larger than the size of the p-type electrode 26. On the bottom face of the n-type GaAs substrate 20 including the bottom and side faces of the recess 28, an n-type electrode 27 is formed.

In the third embodiment, since the thickness of the upper portion 20a of the n-type GaAs substrate 20 above the recess 28 (namely, 50 μm) is smaller than the thickness of the compound semiconductor crystal layer 22 (namely, 100 μm), strain derived from the difference in the lattice constant and the thermal expansion coefficient between the n-type GaAs substrate 20 and the compound semiconductor crystal layer 22 is shared with the n-type GaAs substrate 20. Therefore, the threading dislocations are caused within the n-type GaAs substrate 20. As a result, the strain caused in the compound semiconductor crystal layer 22 derived from the difference in the lattice constant and the thermal expansion coefficient is relaxed, and hence, the threading dislocations caused within the compound semiconductor crystal layer 22 can be decreased.

In the third embodiment in particular, the n-type GaAs substrate 20 has lower hardness than the device structure B. Therefore, the strain caused in the compound semiconductor crystal layer 22 derived from the difference in the lattice constant and the thermal expansion coefficient can be largely relaxed, and hence, the threading dislocations caused in the compound semiconductor crystal layer 22 can be more remarkably decreased.

Accordingly, in the light emitting diode of the third embodiment, the crystallinity of the compound semiconductor crystal layer 22, and furthermore, the crystallinity of the device structure B can be more remarkably improved. As a result, the luminance and the life time of the light emitting diode of the third embodiment can be further remarkably improved as compared with those of the conventional light emitting diode.

As a result of observation of the section of the light emitting diode of the third embodiment with a transmission electron microscope, the number of the threading dislocations caused within the compound semiconductor crystal layer 22 was found to be $3 \times 10^5$ cm$^{-2}$, which is 1/30000 as small as that in the conventional light emitting diode.

Also, the light emitting diode of the third embodiment has a peak wavelength of 450 nm, luminance of 6 cd and a life time of more than 50000 hours in an operation at room temperature. Thus, the light emitting diode can attain the luminance and the life time more than twice as large as those of the conventional light emitting diode.

In the third embodiment, the n-type GaN layer of the compound semiconductor crystal layer 22 and the first cladding layer 23 can be replaced with n-type $Al_xGa_yIn_{1-x-y}N$ (wherein $0 \leq X \leq 1$ and $0 \leq y \leq 1$), and the p-type GaN layer of the second cladding layer 25 can be replaced with p-type $Al_xGa_yIn_{1-x-y}N$ (wherein $0 \leq X \leq 1$ and $0 \leq y \leq 1$).

Furthermore, in the third embodiment, the n-type GaAs substrate 20 can be replaced with a p-type GaAs substrate, an undoped GaAs substrate, a high resistance GaAs substrate, a group III–V compound semiconductor substrate such as a GaP or InP substrate, a Si substrate, an oxide substrate such as a LiGaO$_2$ substrate, a SiC substrate, a MgO substrate or the like.

Moreover, although the size of the upper portion 20a of the n-type GaAs substrate 20 above the recess 28 is slightly larger than the size of the p-type electrode 26 in the third embodiment, the size of the upper portion 20a of the n-type GaAs substrate 20 above the recess 28 can be smaller than the size of the p-type electrode 26. In this case, the number of threading dislocations caused in the n-type GaAs substrate is smaller than in the third embodiment, and hence, the threading dislocations caused in the compound semiconductor crystal layer 22 are increased. However, the number of the threading dislocations in the compound semiconductor crystal layer 22 is still remarkably smaller than in the conventional light emitting diode.

Also, in the third embodiment, the thickness of the upper portion 20a of the n-type GaAs substrate 20 above the recess 28 is smaller by 50 µm than the thickness of the compound semiconductor crystal layer 22, which does not limit the invention. When the thickness of the upper portion 20a of the n-type GaAs substrate 20 above the recess 28 is substantially equal to the thickness of the compound semiconductor crystal layer 22 (specifically, the thickness of the compound semiconductor crystal layer 22 ±10%) or smaller, the number of the threading dislocations caused within the compound semiconductor crystal layer 22 can be decreased.

Now, a method of manufacturing the light emitting diode of the third embodiment will be described with reference to FIGS. 9(a) through 9(c).

Figure 9A:
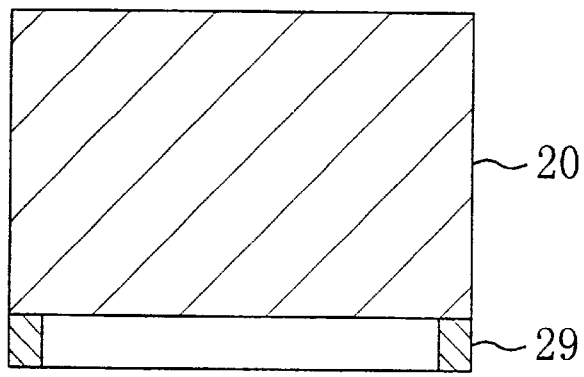
FIGS. 9(a) through 9(c) are sectional views for showing manufacturing procedures for the light emitting diode of the third embodiment.

First, as is shown in FIG. 9(a), in the periphery of one surface (bottom face) of the n-type GaAs substrate 20 with a thickness of 300 µm, a mask 29 of a thermosetting resin is formed.

Figure 9B:
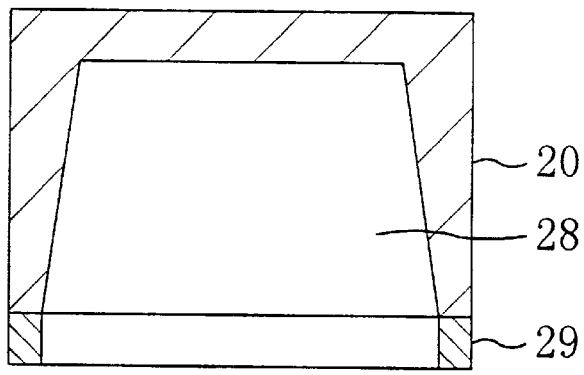
Figure 9C:
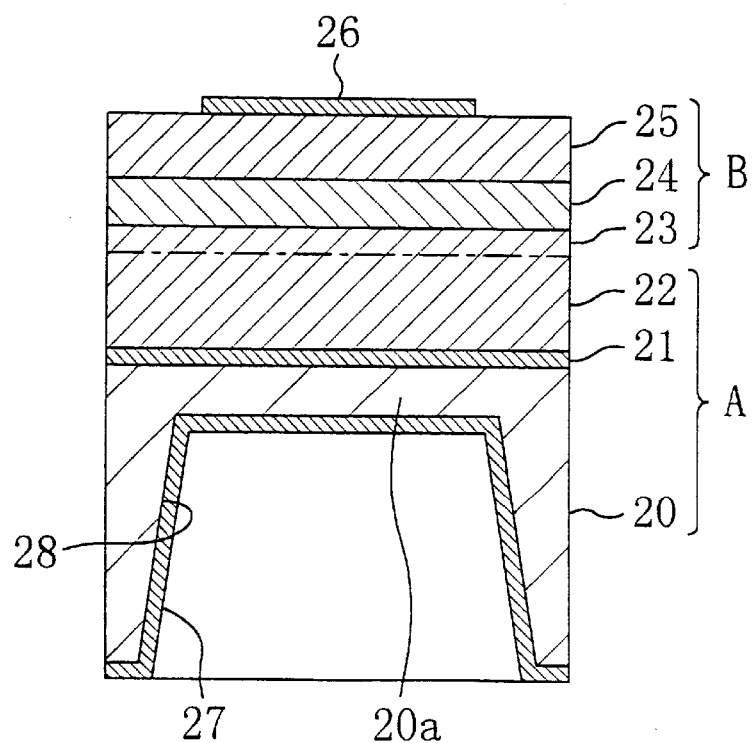

Next, this surface of the n-type GaAs substrate 20 is wet-etched by using, for example, a mixed solution of sulfuric acid and hydrogen peroxide, thereby etching a portion of the n-type GaAs substrate 20 not covered with the mask 29 into a thickness of 50 µm as is shown in FIG. 9(b).

Then, after the mask 29 is removed, on the other surface (i.e., top face) of the n-type GaAs substrate 20, the buffer layer 21 of n-type GaN with a thickness of 30 nm is formed by the MOCVD, and on the buffer layer 21, the compound semiconductor crystal layer 22 of n-type GaN with a thickness of 100 µm is formed by the chloride vapor phase epitaxy. Thus, the substrate A of the light emitting diode including the n-type GaAs substrate 20, the buffer layer 21 and the compound semiconductor crystal layer 22 is formed.

Then, on the compound semiconductor crystal layer 22, the first cladding layer 23 of n-type GaN with a thickness of 2 µm, the active layer 24 of undoped $In_{0.2}Ga_{0.8}N$ with a thickness of 3 nm and the second cladding layer 25 of p-type GaN with a thickness of 1 µm are successively formed by the MOCVD. Thus, the device structure B of the light emitting diode including the first cladding layer 23, the active layer 24 and the second cladding layer 25 is formed. Thereafter, the p-type electrode 26 is formed on the second cladding layer 25, and the n-type electrode 27 is formed on the entire bottom face of the n-type GaAs substrate 20 including the bottom and side faces of the recess 28. In this manner, the light emitting diode of the third embodiment can be completed as is shown in FIG. 9(c).

Since dry etching is not adopted in the etching of the n-type GaAs substrate 20 and the formation of the device structure B in the manufacturing method of the third embodiment, the light emitting diode can be prevented from being damaged through the dry etching, resulting in improving the characteristic of the resultant light emitting diode. In the case where a damage on the light emitting diode by the dry etching can be accepted, the dry etching can be adopted for etching the n-type GaAs substrate 20.

As the mask 29, a photoresist, a SiO$_2$ film, a vapor deposited metal film or the like can be used as far as it has soluble resistance against the etching solution to be used. As the etching solution, any acidic etching solution such as a hydrochloride etching solution, a nitrate etching solution and an organic acid etching solution can be used as far as etch selectivity between the n-type GaAs substrate 20 and the mask 29 can be secured.

Also, in the case where a p-type GaAs substrate, an undoped GaAs substrate, a high resistance GaAs substrate or a group III–V compound semiconductor substrate is used instead of the n-type GaAs substrate 20, the etching procedure can be conducted in the same manner as in using the n-type GaAs substrate 20. In the case where a Si substrate is used, an acid solution including hydrofluoric acid is preferably used as the etching solution. In the case where an oxide substrate such as a LiGaO$_2$ substrate or a SiC substrate is used, the etching is preferably carried out by the dry etching. In the case where a MgO substrate is used, an aqueous solution including an acid or ammonium salt is preferably used as the etching solution.

Embodiment 4

Figure 10:
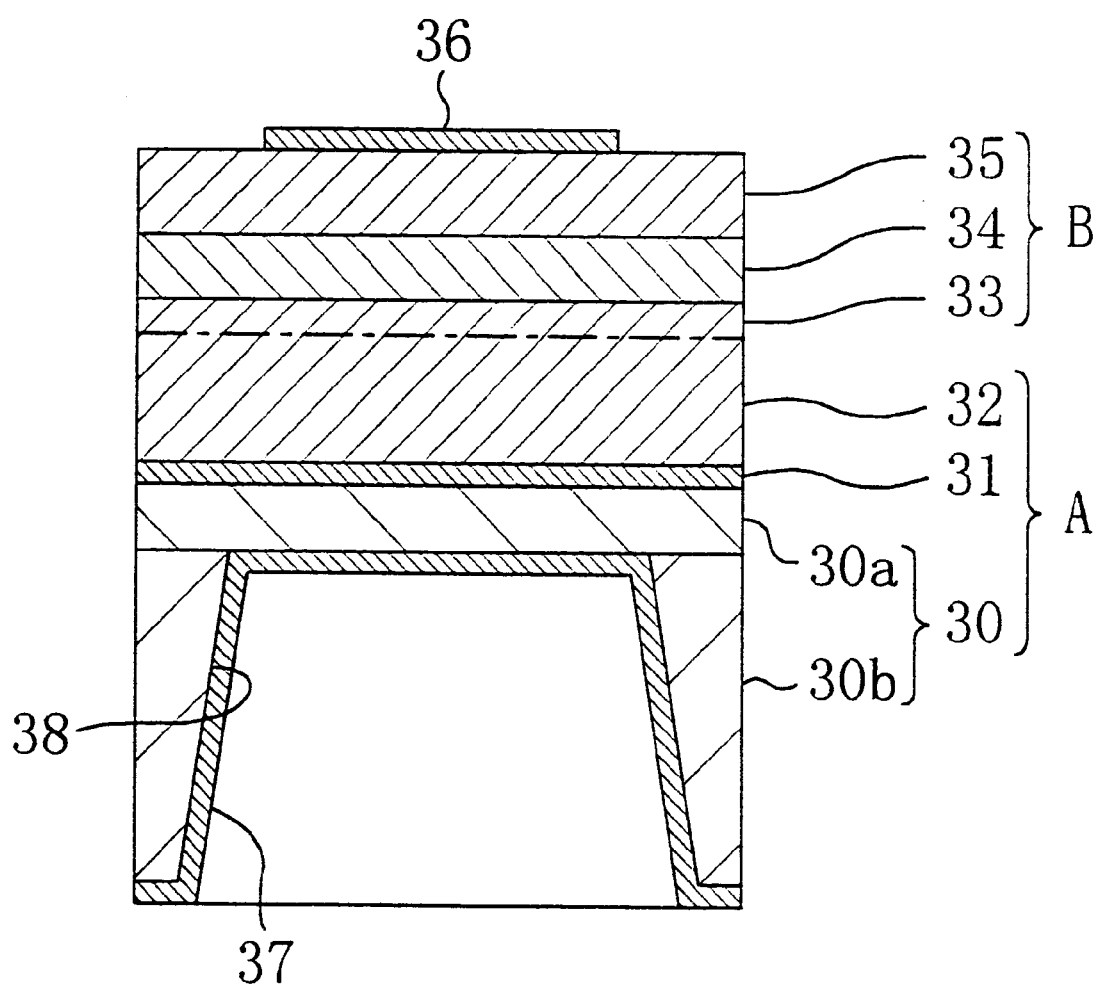
FIG. 10 is a sectional view of a light emitting diode according to a fourth embodiment of the invention.

A light emitting diode, that is, a semiconductor device according to a fourth embodiment of the invention, will now be described with reference to FIG. 10. FIG. 10 is a sectional view of the light emitting diode of the fourth embodiment.

As is shown in FIG. 10, the light emitting diode of the fourth embodiment includes a composite substrate 30 consisting of a base portion 30a of an n-type SiC layer with a thickness of 5 μm and a frame portion 30b of an n-type Si plate with a height of 250 μm integrated with the periphery of the bottom face of the base portion 30a. Thus, a recess 38 having a trapezoidal section with a depth of 250 μm is formed in a lower portion of the composite substrate 30, and an upper portion of the composite substrate 30 above the recess 38 has a thickness of 5 μm.

On the top face of the base portion 30a of the composite substrate 30, a buffer layer 31 of n-type GaN with a thickness of 30 nm and a compound semiconductor crystal layer 32 of n-type GaN with a thickness of 100 μm are successively formed. The composite substrate 30, the buffer layer 31 and the compound semiconductor crystal layer 32 together form a substrate A of the light emitting diode.

On the compound semiconductor crystal layer 32, a first cladding layer 33 of n-type GaN with a thickness of 2 μm, an active layer 34 of undoped $In_{0.2}Ga_{0.8}N$ with a thickness of 3 nm and a second cladding layer 35 of p-type GaN with a thickness of 1 μm are successively formed. The first cladding layer 33, the active layer 34 and the second cladding layer 35 together form a device structure B of the light emitting diode. On the second cladding layer 35, a p-type electrode 36 is formed, and on the bottom face of the composite substrate 30 including the bottom and side faces of the recess 38, an n-type electrode 37 is formed.

In the light emitting diode of the fourth embodiment, since the thickness of the base portion 30a corresponding to the upper portion of the composite substrate 30 above the recess 38 (namely, 5 μm) is smaller by 95 μm than the thickness of the compound semiconductor crystal layer 32 (namely, 100 μm), most of strain derived from the difference in the lattice constant and the thermal expansion coefficient between the base portion 30a of the composite substrate 30 and the compound semiconductor crystal layer 32 is caused in the base portion 30a of the composite substrate 30. Therefore, a large number of threading dislocations occur within the base portion 30a of the composite substrate 30. As a result, the strain derived from the difference in the lattice constant and the thermal expansion coefficient can be relaxed within the compound semiconductor crystal layer 32, and the number of threading dislocations caused in the compound semiconductor crystal layer 32 can be decreased. Thus, the crystallinity of the compound semiconductor crystal layer 32, and furthermore, the crystallinity of the device structure B can be improved.

As a result of observation of the section of the light emitting diode of the fourth embodiment with a transmission electron microscope, the number of the threading dislocations caused in the compound semiconductor crystal layer 32 was found to be $1 \times 10^6$ cm, which is 1/10000 as small as that in the conventional light emitting diode.

Furthermore, the light emitting diode of the fourth embodiment has a peak wavelength of 450 nm, luminance of 6 cd, and a life time of 50000 hours or more in an operation at room temperature. Thus, the light emitting diode can attain the luminance and life time more than twice as large as those of the conventional light emitting diode.

Also in the fourth embodiment, the size of the upper portion in the base portion 30a of the composite substrate 30 above the recess 38 is slightly larger than the size of the p-type electrode 36, and the upper portion can be smaller than the p-type electrode 36. In this case, the number of the threading dislocations caused in the base portion 30a of the composite substrate 30 is smaller than in the fourth embodiment, and the threading dislocations caused in the compound semiconductor crystal layer 32 are increased. However, the number of the threading dislocations caused in the compound semiconductor crystal layer 32 is still remarkably smaller than in the conventional light emitting diode.

Furthermore, as materials for the base portion 30a and the frame portion 30b of the composite substrate 30, the combination of the n-type SiC layer and the n-type Si plate can be replaced with a combination of a ZnO crystal layer and a Si plate, a combination of a MgO crystal layer and a Si plate, or one ore more $Al_zGa_{1-y}As$ (wherein $0 \leq z \leq 1$) crystal layer and a GaAs crystal substrate.

Also in the light emitting diode of the fourth embodiment, the n-type GaN layer of the compound semiconductor crystal layer 32 and the first cladding layer 33 can be replaced with an n-type $Al_xG_yIn_{1-x-y}N$ layer (wherein $0 \leq X \leq 1$ and $0 \leq y \leq 1$) and the p-type GaN layer of the second cladding layer 35 can be replaced with a p-type $Al_xGa_yIn_{1-x-y}N$ layer (wherein $0 \leq X \leq 1$ and $0 \leq y \leq 1$).

Now, a method of manufacturing the light emitting diode of the fourth embodiment will be described with reference to FIGS. 11(a) through 11(c).

Figure 11A:
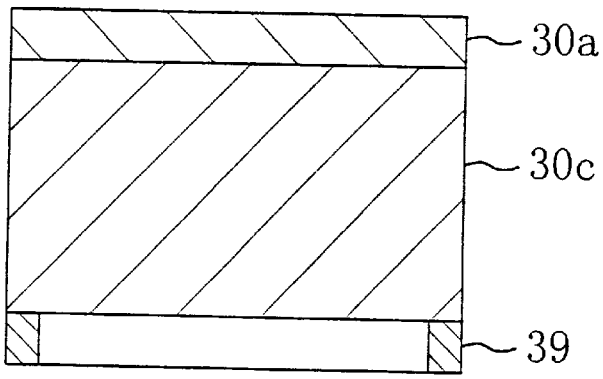
FIGS. 11(a) through 11(c) are sectional views for showing manufacturing procedures for the light emitting diode of the fourth embodiment.
Figure 11B:
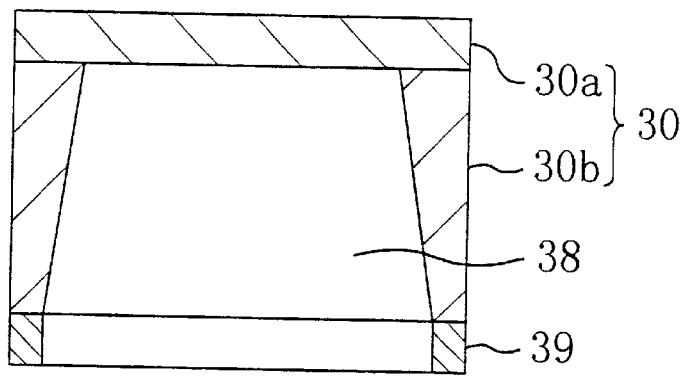
Figure 11C:
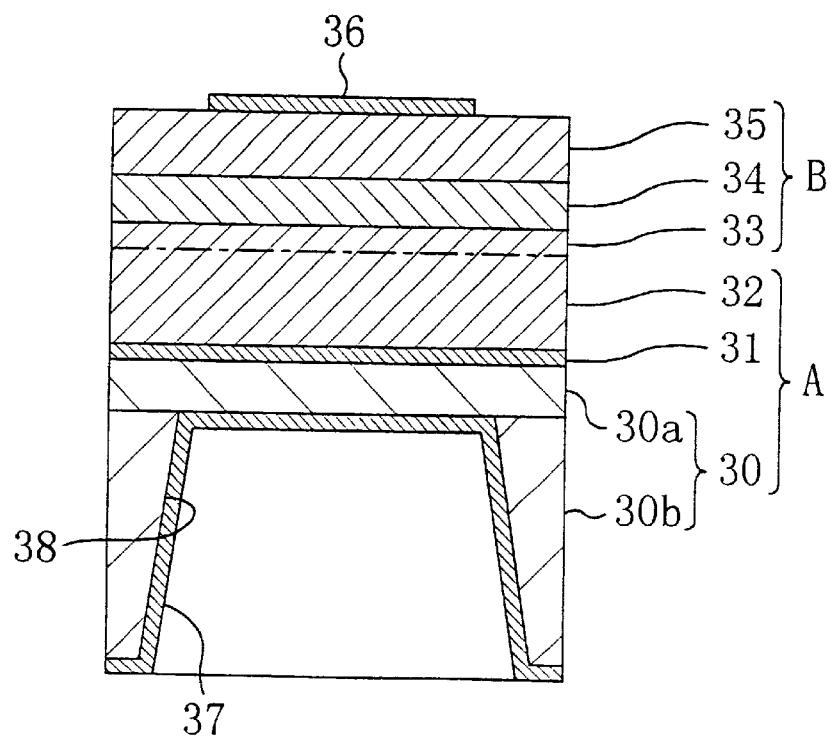

First, as is shown in FIG. 11(a), on an n-type Si plate 30c with a thickness of 250 μm, the base portion 30a of an n-type SiC layer is grown into a thickness of, for example, 5 μm by the vapor phase growth. Then, a mask 39 is formed in the periphery of one surface (bottom face) of the n-type Si plate 30c.

Next, selective etching is conducted so that a portion of the n-type Si substrate 30c not covered with the mask 39 can be removed and the entire substrate 30a and a portion of the n-type Si plate 30c covered with the mask 39 can remain. As a result, the composite substrate 30 including the base portion 30a of the n-type SiC layer with a thickness of 5 μm and the frame portion 30b of the n-type Si plate with a height of 250 μm integrated with the periphery of the bottom face of the base portion 30a can be formed as is shown in FIG. 11(b).

Then, after the mask 39 is removed, the buffer layer 31 of n-type GaN with a thickness of 30 nm is formed on the composite substrate 30 by the MOCVD, and on the buffer layer 31, the compound semiconductor crystal layer 32 of n-type GaN with a thickness of 100 μm is formed by the chloride vapor phase epitaxy. Thus, the substrate A of the light emitting diode including the composite substrate 30, the buffer layer 31 and the compound semiconductor crystal layer 32 is formed.

Next, on the compound semiconductor crystal layer 32, the first cladding layer 33 of n-type GaN with a thickness of 2 μm, the active layer 34 of undoped $In_{0.2}Ga_{0.8}N$ with a thickness of 3 nm and the second cladding layer 35 of p-type GaN with a thickness of 1 μm are successively formed. Thus, the device structure B of the light emitting diode including the first cladding layer 33, the active layer 34 and the second cladding layer 35 is formed. Thereafter, the p-type electrode 36 is formed on the second cladding layer 35, and the n-type electrode 37 is formed over the entire bottom face of the composite substrate 30 including the bottom and side faces of the recess 38. Thus, the light emitting diode of the fourth embodiment can be completed as is shown in FIG. 11(c).

According to the manufacturing method of the fourth embodiment, the composite substrate 30 including the base portion 30a and the frame portion 30b integrated with the periphery of the bottom face of the base portion 30a is formed through the selective etching for etching the portion of the n-type Si plate 30c not covered with the mask 39. As a result, the composite substrate 30 including the recess 38 with a depth of 250 $\mu$m at the lower portion and the upper portion above the recess 38 with a thickness of 5 $\mu$m can be manufactured with good reproducibility.

Although the portion of the n-type Si plate 30c not covered with the mask 39 is all etched in the fourth embodiment, the portion of the n-type Si plate 30c not covered with the mask 39 can partially remain. In this case, a sum of the thickness of the base portion 30a of the n-type SiC layer and the thickness of a remaining portion of the n-type Si plate 30c is required to be substantially equal to or smaller than the thickness of the compound semiconductor crystal layer 32.

Embodiment 5

Figure 12:
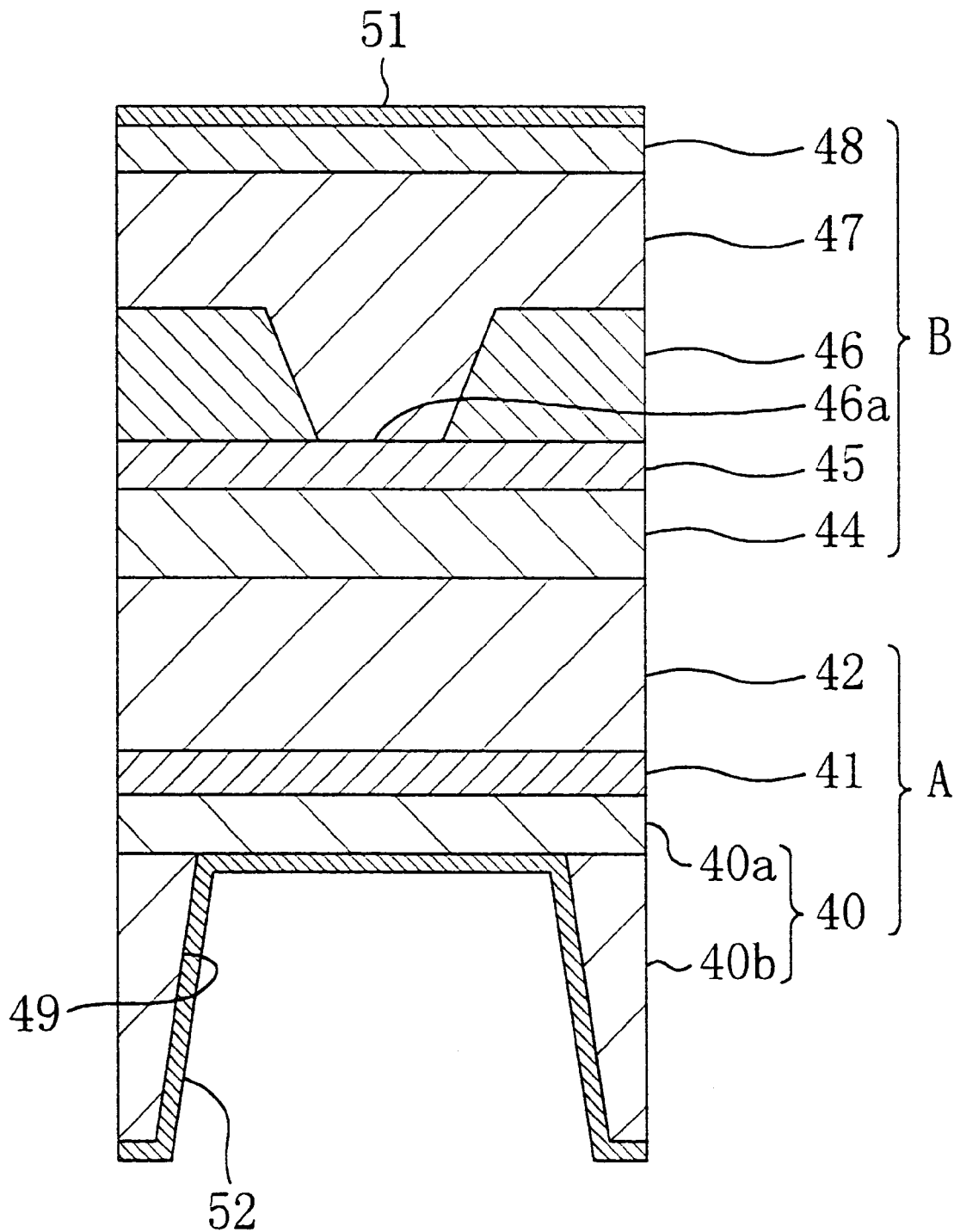
FIG. 12 is a sectional view of a semiconductor laser diode according to a fifth embodiment of the invention.

A semiconductor laser diode, that is, a semiconductor device according to a fifth embodiment of the invention will now be described with reference to FIG. 12. FIG. 12 is a sectional view of the semiconductor laser diode of the fifth embodiment.

As is shown in FIG. 12, the semiconductor laser diode of the fifth embodiment includes a composite substrate 40 consisting of a base portion 40a of an n-type SiC layer and a side portion 40b of an n-type Si plate integrated with the side part of the bottom face of the base portion 40a. As a result, a recess 49 having a trapezoidal section is formed in a lower portion of the composite substrate 40. On the top surface of the base portion 40a of the composite substrate 40, a buffer layer 41 of n-type GaN and a compound semiconductor crystal layer 42 of n-type GaN are successively formed. The composite substrate 40, the buffer layer 41 and the compound semiconductor crystal layer 42 together form a substrate A of the semiconductor laser diode.

On the compound semiconductor crystal layer 42, a first cladding layer 44 of n-type AlGaN, an undoped active layer 45, and a current blocking layer 46 of n-type AlGaN having a stripe-shaped window 46a are successively formed. Furthermore, on the current blocking layer 46, a second cladding layer 47 of p-type AlGaN is formed so as to bury the stripe-shaped window 46a, and on the second cladding layer 47, a contact layer 48 of p-type GaN is formed. The undoped active layer 45 has a multiple quantum well structure in which $In_{0.08}Ga_{0.92}N$ and $In_{0.15}Ga_{0.85}N$ are alternately stacked. On the contact layer 48, a p-type electrode 51 is formed, and on the bottom face of the composite substrate 40 including the bottom and side faces of the recess 49, an n-type electrode 52 is formed.

As a characteristic of the fifth embodiment, the thickness of the base portion 40a corresponding to an upper portion of the composite substrate 40 above the recess 49 is substantially the same as or smaller than the thickness of the compound semiconductor crystal layer 42. Also, in this semiconductor laser diode, since light is guided along the stripe-shaped window 46a of the current blocking layer 46, the recess 49 having a trapezoidal section is formed in the lower portion of the composite substrate 40, and the width of the upper portion in the base portion 40a of the composite substrate 40 above the recess 49 is larger than the width of the stripe-shaped window 46a.

Therefore, most of strain derived from the difference in the lattice constant and the thermal expansion coefficient between the base portion 40a of the composite substrate 40 and the compound semiconductor crystal layer 42 is caused in the base portion 40a of the composite substrate 40. As a result, a large number of threading dislocations occur within the base portion 40a of the composite substrate 40. Accordingly, the strain derived from the difference in the lattice constant and the thermal expansion coefficient is largely relaxed in the compound semiconductor crystal layer 42, and hence, the number of the threading dislocations caused within the compound semiconductor crystal layer 42 is decreased. In this manner, the crystallinity of the compound semiconductor crystal layer 42, and furthermore, the crystallinity of the device structure B including the first cladding layer 44, the undoped active layer 45, the current blocking layer 46, the second cladding layer 47 and the contact layer 48, can be improved.

The semiconductor laser diode of the fifth embodiment is of an internal stripe type, but the semiconductor laser diode can include another type waveguide mechanism like a Ridge type semiconductor laser diode.

Also in the fifth embodiment, the undoped active layer 45 has the multiple quantum well structure in which $In_{0.08}Ga_{0.92}N$ and $In_{0.15}Ga_{0.85}N$ are alternately stacked, but the active layer can be a single layer of InGaN or have a multiple quantum well structure in which GaN and InGaN are alternately stacked.

Now, a method of manufacturing the semiconductor laser diode of the fifth embodiment will be described. Since the method of manufacturing the semiconductor laser diode of the fifth embodiment is basically similar to that of manufacturing the light emitting diode of the fourth embodiment, the description will be given with reference to FIG. 12.

First, on an n-type Si plate, the base portion of an n-type SiC layer is grown by the vapor phase growth, and a mask is formed on the side part of one surface of the n-type Si plate. Then, the selective etching is conducted so that a portion of the n-type Si plate not covered with the mask can be removed and the entire base portion and a portion of the n-type Si plate covered with the mask can remain. Thus, the composite substrate 40 including the base portion 40a and the side portion 40b integrated with the bottom face of the base portion 40a is formed.

Next, on the other surface of the composite substrate 40, the buffer layer 41 of n-type GaN is formed by the MOCVD, and on the buffer layer 41, the compound semiconductor crystal layer 42 of n-type GaN is formed by the chloride vapor phase epoxy. Thus, the substrate A of the semiconductor laser diode including the composite substrate 40, the buffer layer 41 and the compound semiconductor crystal layer 42 is formed.

Then, on the compound semiconductor crystal layer 42, the first cladding layer 44 of n-type AlGaN, the undoped active layer 45 and the current blocking layer 46 of n-type AlGaN are formed by the MOCVD, and the stripe-shaped window 46a is formed in the current blocking layer 46 by the dry etching. Thereafter, on the current blocking layer 46, the second cladding layer 47 of p-type AlGaN and the contact layer 48 of p-type GaN are successively formed by the MOCVD, thereby forming the device structure B. Then, the p-type electrode 51 is formed on the contact layer 48 and the n-type electrode 52 is formed on the bottom face of the composite substrate 40 including the bottom and side faces of the recess 49 through deposition. In this manner, the semiconductor laser diode of the fifth embodiment can be completed.

Embodiment 6

Figure 13:
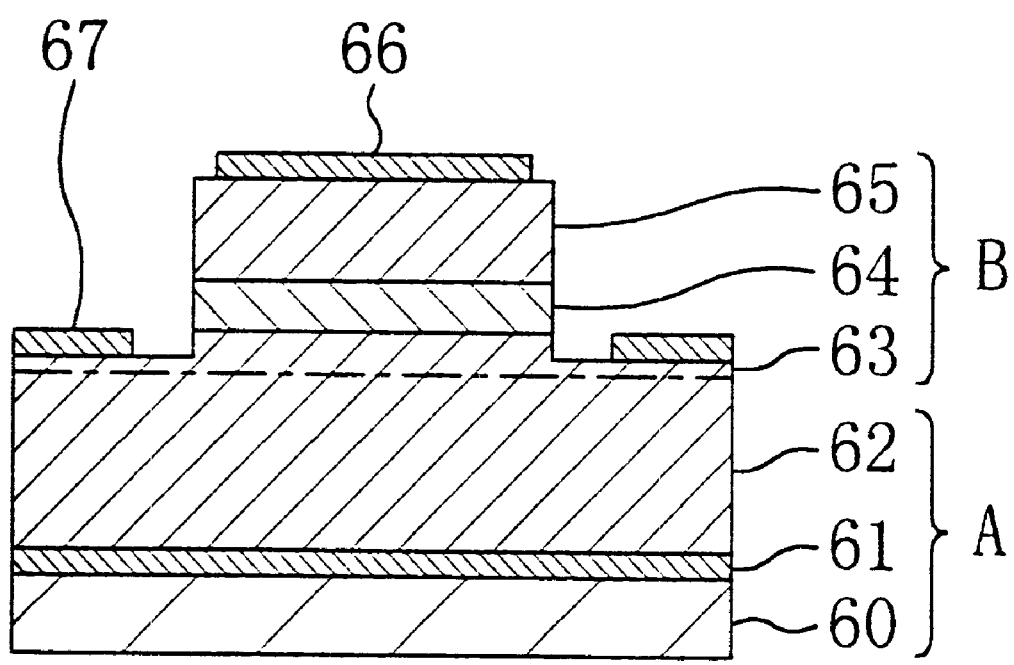
FIG. 13 is a sectional view of a light emitting diode according to a sixth embodiment of the invention.

A light emitting diode, that is, a semiconductor device according to a sixth embodiment of the invention, will now be described with reference to FIG. 13. FIG. 13 is a view of the light emitting diode of the sixth embodiment.

As is shown in FIG. 13, on a sapphire substrate 60 with a thickness of 50 μm, a buffer layer 61 of undoped GaN with a thickness of 30 nm and a compound semiconductor crystal layer 62 of n-type GaN with a thickness of 100 μm are successively formed. The sapphire substrate 60, the buffer layer 61 and the compound semiconductor crystal layer 62 together form a substrate A of the light emitting diode.

On the compound semiconductor crystal layer 62, a first cladding layer 63 of n-type GaN with a thickness of 2 μm, an active layer 64 of undoped $In_{0.2}Ga_{0.8}N$ with a thickness of 3 nm and a second cladding layer 65 of p-type GaN with a thickness of 1 μm are successively formed. The first cladding layer 63, the active layer 64 and the second cladding layer 65 together form a device structure B of the light emitting diode. The device structure B is partially removed so as to bare the inside of the first cladding layer 63.

On the second cladding layer 65, a p-type electrode 66 is formed, and on the first cladding layer 63, an n-type electrode 67 is formed.

In the light emitting diode of the sixth embodiment, the thickness of the sapphire substrate 60 is smaller by 50 μm than the thickness of the compound semiconductor crystal layer 62. Therefore, strain derived from the difference in the lattice constant and the thermal expansion coefficient between the sapphire substrate 60 and the compound semiconductor crystal layer 62 is shared with the sapphire substrate 60, and hence, the threading dislocations occur in the sapphire substrate 60. Accordingly, the strain derived from the difference in the lattice constant and the thermal expansion coefficient can be relaxed in the compound semiconductor crystal layer 62, resulting in decreasing the number of threading dislocations caused within the compound semiconductor crystal layer 62. Thus, the crystallinity of the compound semiconductor crystal layer 62, and furthermore, the crystallinity of the device structure B can be improved.

Now, a method of manufacturing the light emitting diode of the sixth embodiment will be described with reference to FIGS. 14(a) through 14(c).

Figure 14A:
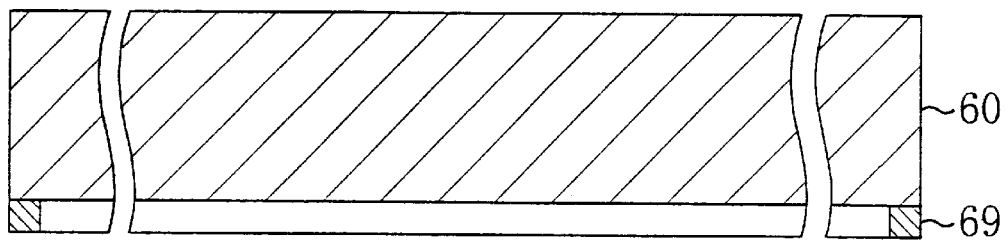
FIGS. 14(a) through 14(c) are sectional views for showing a method of manufacturing the light emitting diode of the sixth embodiment.
Figure 14B:
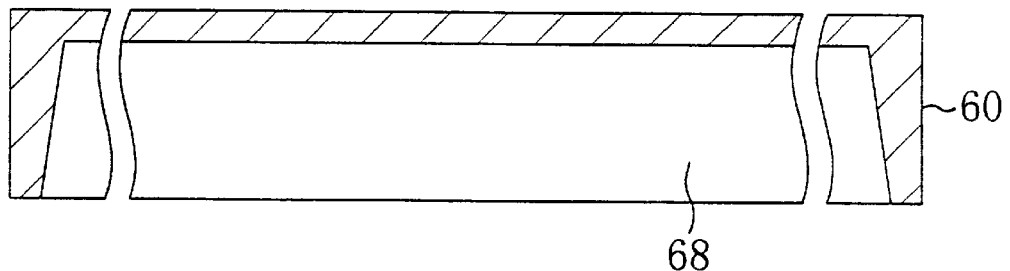

First, as is shown in FIG. 14(a), after a mask 69 is formed in the periphery of a bottom surface of a wafer-like sapphire substrate 60 with a thickness of, for example, 300 μm is formed, a portion of the sapphire substrate 60 not covered with the mask 69 is removed by etching as is shown in FIG. 14(b). Thus, a recess 68 is formed, and an upper portion of the sapphire substrate 60 above the recess 68 is made to have a thickness of 50 μm.

Figure 14C:
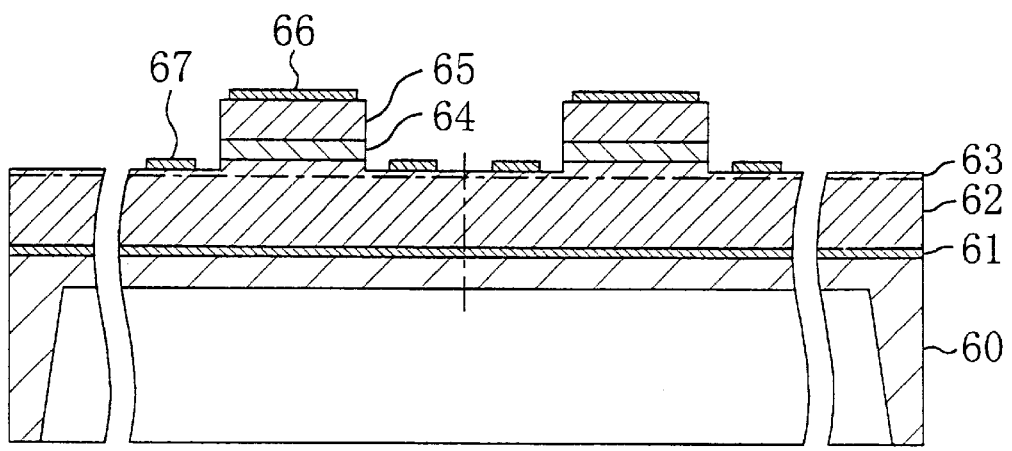
Figure 15:
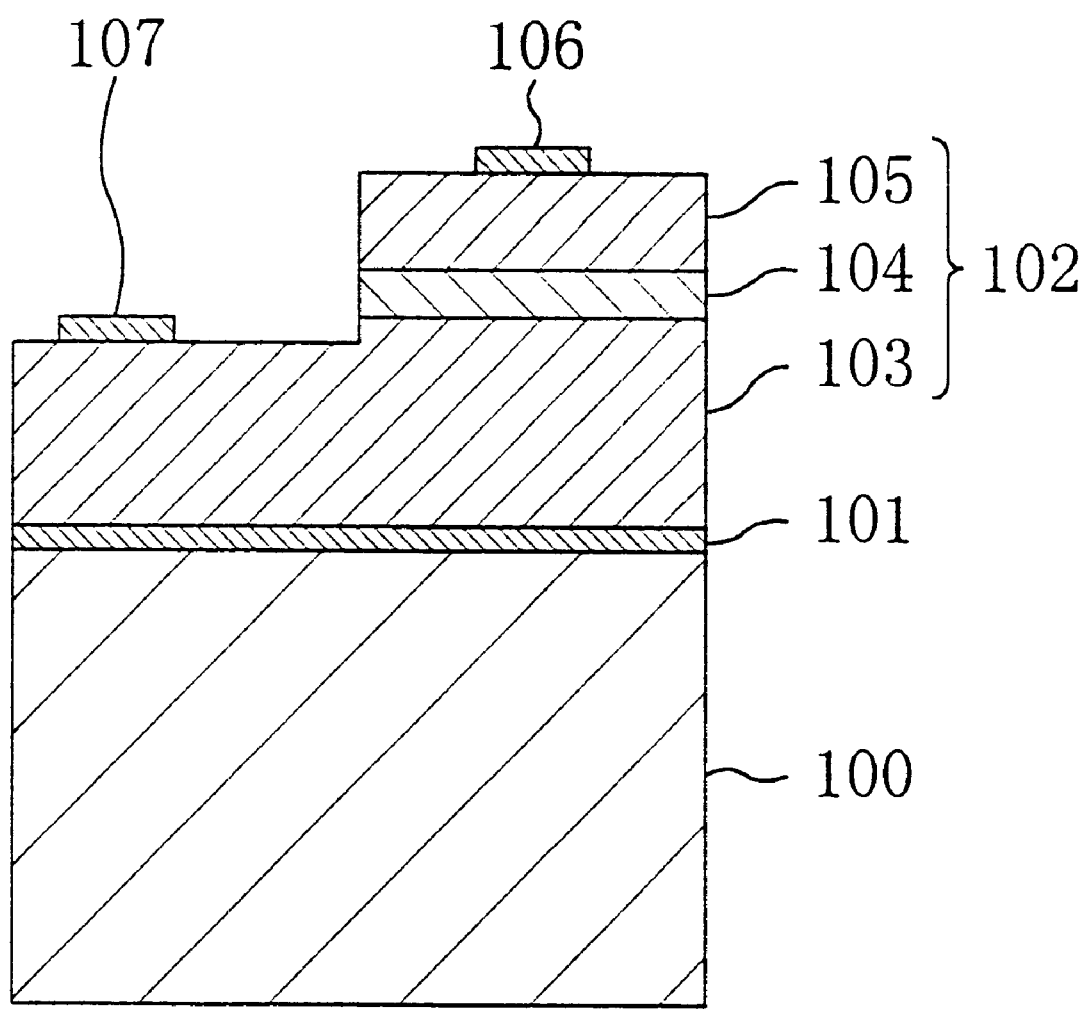
FIG. 15 is a sectional view of a conventional light emitting diode.

Next, as is shown in FIG. 14(c), on the top surface of the sapphire substrate 60, the buffer layer 61 of undoped GaN is formed by the MOCVD, and on the buffer layer 61, the compound semiconductor crystal layer 62 of n-type GaN with a thickness of 100 μm is formed by the chloride vapor phase epitaxy. Thus, the substrate A of the light emitting diode including the sapphire substrate 60, the buffer layer 61 and the compound semiconductor crystal layer 62 is formed.

Then, on the compound semiconductor crystal layer 62, the first cladding layer 63 of n-type GaN, the active layer 64 of undoped $In_{0.2}Ga_{0.8}N$ and the second cladding layer 65 of n-type GaN are successively formed by the MOCVD. Thus, the device structure B of the light emitting diode including the first cladding layer 63, the active layer 64 and the second cladding layer 65 is formed. Then, the p-type electrode 66 and the n-type electrode 67 are formed on the second cladding layer 65 and the first cladding layer 63, respectively by the evaporation. Thereafter, device forming areas of the substrate A are cut, thereby obtaining the light emitting diode of the sixth embodiment.

In each of the first through sixth embodiments, the nitride compound semiconductor crystal layer is formed by the MOCVD or the chloride vapor phase epitaxy which has a high growth rate and can secure crystallinity of a film to be grown, but sublimation, molecular beam epitaxy, liquid phase epitaxy or the like can be adopted instead.

Furthermore, in each of the second through sixth embodiments, the device structure B can be subjected to a heat treatment at a temperature of 600° C. in a nitrogen atmosphere at 760 Torr. In this case, since the heat treatment has an effect to move threading dislocations in crystal, the threading dislocations caused in the compound semiconductor crystal layer 12, 62, 22, 32 or 42 can be moved to the sapphire substrate 10 or 60, the n-type GaAs substrate 20, or the base portion 30a or 40a of the composite substrate 30 or 40. Thus, the threading dislocations caused in the substrate A can be further decreased. As a result, the number of the threading dislocations caused within the device structure B can be further decreased.

The lower limit temperature for the heat treatment is preferably 250° C. or more. Through the heat treatment at a temperature exceeding 250° C., the threading dislocations within crystal can be moved.

The upper limit temperature for the heat treatment depends upon the type of substrate. On a substrate that is dissociated at a high temperature such as a GaAs substrate, the upper limit temperature is preferably 800° C. or lower. Since an oxide substrate such as a $LiGaO_2$ substrate or a SiC substrate has a high dissociation temperature, the upper limit temperature can be 800° C. or more on such a substrate.

The atmosphere gas for the heat treatment can be any inert gas such as argon and nitrogen when the heat treatment is conducted at a temperature where the substrate is not thermally dissociated. When the heat treatment is conducted at a high temperature where the substrate can be thermally dissociated, a gas including a composition element of the substrate such as an arsine gas can be used.

Furthermore, in each of the second through sixth embodiments, the semiconductor device includes a nitride compound semiconductor, but the semiconductor device of the invention is also applicable to a group IV—IV compound semiconductor such as SiC, and a group II–VI compound semiconductor such as ZnS and ZnSe.

Moreover, although the semiconductor devices described in the second through fourth and sixth embodiments are light emitting diodes and the semiconductor device described in the fifth embodiment is a semiconductor laser diode, the respective embodiments of the invention are applicable to any semiconductor device such as a field effect transistor as far as the device includes a compound semiconductor.

What is claimed is:

1. A method of manufacturing a semiconductor substrate comprising:

a step of forming a recess on a bottom face of a crystal substrate; and a step of forming a compound semiconductor crystal layer over a top face of said crystal substrate having said recess, said compound semiconductor crystal layer having a different lattice constant from said crystal substrate, wherein said step of forming said recess includes a step of controlling a thickness of a portion of said crystal substrate, over which plural device structures are to be formed, so as to be substantially equal to or smaller than a thickness of said compound semiconductor crystal layer.

2. The method of manufacturing a semiconductor substrate of claim 1, further comprising a step of removing said crystal substrate after said step of forming said compound semiconductor crystal layer.

3. The method of claim 1, wherein said thickness portion of said crystal substrate, over which plural devices structures are to be formed, is greater than zero.

4. A method of fabricating semiconductor devices, comprising the steps of:

forming a recess in a bottom face of a crystal substrate;

forming a compound semiconductor crystal layer over a top face of the crystal substrate having the recess, the compound semiconductor crystal layer having a different lattice constant from the crystal substrate, thereby to form a semiconductor substrate comprising the crystal substrate and the compound semiconductor crystal layer;

forming a device structure on the semiconductor substrate; and cutting the semiconductor substrate, wherein the step of forming the recess includes a step of controlling a thickness of a central area of a portion of the crystal substrate over which the device structure is to be formed, respectively, so as to be substantially equal to or smaller than a thickness of the compound semiconductor crystal layer to be formed.

5. The method of claim 4, wherein the step of forming the recess includes:

a step of forming, on a frame body, a base portion of a crystal layer having etch selectivity against the frame body; and a step of forming a frame portion out of the frame body by conducting selective etching a bottom face of the frame body disposed on the base portion, a periphery of the frame body remaining after etching.

6. The method of claim 4, wherein the step of forming the recess includes:

a step of forming, on a frame body, a base portion of a crystal layer having etch selectivity against the frame body; and a step of forming a side portion out of the frame body by conducting selective etching a bottom face of the frame body disposed on the base portion, a side part of the frame body remaining after etching.

7. The method of claim 4, further comprising, between the step of forming the compound semiconductor crystal layer and the step of forming the device structure, a step of moving threading dislocations caused in the compound semiconductor crystal layer to the crystal substrate by conducting a heat treatment on the compound semiconductor crystal layer.

8. The method of claim 4, wherein said thickness portion of said crystal substrate, over which plural devices structures are to be formed, is greater than zero.

9. A method of fabricating semiconductor devices, comprising the steps of:

forming a recess in a bottom face of a crystal substrate;

forming a compound semiconductor crystal layer over a top face of the crystal substrate having the recess, the compound semiconductor crystal layer having a different lattice constant from the crystal substrate, thereby to form a semiconductor substrate comprising the crystal substrate and the compound semiconductor crystal layer;

forming plural device structures on the semiconductor substrate; and cutting the semiconductor substrate having the plural device structures formed thereon, thereby to form plural semiconductor devices, wherein the step of forming the recess includes a step of controlling a thickness of a portion of the crystal substrate, over which the plural device structures;are to be formed, so as to be substantially equal to or smaller than a thickness of the compound semiconductor crystal layer to be formed.

10. The method of claim 9, further comprising, between the step of forming the compound semiconductor crystal layer and the step of forming the plural device structures, a step of moving threading dislocations caused in the compound semiconductor crystal layer to the crystal substrate by conducting a heat treatment on the compound semiconductor crystal layer.

11. The method of claim 9, wherein said thickness portion of said crystal substrate, over which plural devices structures are to be formed, is greater than zero.

* * * * *